US012672431B2

(12) United States Patent
Yan et al.

(10) Patent No.: US 12,672,431 B2
(45) Date of Patent: Jun. 30, 2026

(54) DISPLAY SUBSTRATE AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Zhuoran Yan, Beijing (CN); Fengli Ji, Beijing (CN); Hongjun Zhou, Beijing (CN); Zhenli Zhou, Beijing (CN); Yanwei Lu, Beijing (CN); Yudiao Cheng, Beijing (CN); Chengjie Qin, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 420 days.

(21) Appl. No.: 18/559,064

(22) PCT Filed: Oct. 31, 2022

(86) PCT No.: PCT/CN2022/128723
§ 371 (c)(1),
(2) Date: Nov. 6, 2023

(87) PCT Pub. No.: WO2024/092436
PCT Pub. Date: May 10, 2024

(65) Prior Publication Data
US 2025/0098422 A1 Mar. 20, 2025

(51) Int. Cl.
*H10K 59/121* (2023.01)
*H10K 59/131* (2023.01)

(52) U.S. Cl.
CPC ....... *H10K 59/1216* (2023.02); *H10K 59/131* (2023.02)

(58) Field of Classification Search
CPC .. H10K 59/1216; H10K 59/131; H10K 59/10; G02F 1/1362
See application file for complete search history.

(56) References Cited

U.S. PATENT DOCUMENTS

| | | | |
|---|---|---|---|
| 12,402,479 B2 * | 8/2025 | Park | H10D 86/423 |
| 2021/0036087 A1 | 2/2021 | Kwak et al. | |

(Continued)

FOREIGN PATENT DOCUMENTS

| | | |
|---|---|---|
| CN | 107221536 A | 9/2017 |
| CN | 112086065 A | 12/2020 |

(Continued)

*Primary Examiner* — David Vu
(74) *Attorney, Agent, or Firm* — Ling Wu; Stephen Yang; Ling and Yang Intellectual Property

(57) ABSTRACT

A display substrate comprises a display area and a bezel area, wherein a side of the display area close to the bezel area forms a first step-shaped display area boundary, the bezel area at least comprises a capacitance area, the capacitance area comprises a plurality of compensation capacitors, and the plurality of compensation capacitors form a second step-shaped capacitance area boundary on a side far away from the display area; the display area boundary comprises a plurality of first steps connected in sequence, the first steps having a first step length and a first step width, and the capacitance area boundary comprises a plurality of second steps connected in sequence.

20 Claims, 17 Drawing Sheets

(56)         References Cited

U.S. PATENT DOCUMENTS

| 2021/0036091 | A1 | 2/2021 | Kwak et al. |
| 2022/0102473 | A1 | 3/2022 | Zhang |
| 2022/0320228 | A1 | 10/2022 | Du et al. |
| 2023/0033513 | A1 | 2/2023 | Zhou et al. |
| 2023/0136237 | A1 | 5/2023 | Wei et al. |

FOREIGN PATENT DOCUMENTS

| CN | 112310163 | A | 2/2021 |
| CN | 112310166 | A | 2/2021 |
| CN | 113554969 | A | 10/2021 |
| CN | 114464644 | A | 5/2022 |
| CN | 114667553 | A | 6/2022 |

* cited by examiner

DISPLAY SUBSTRATE AND DISPLAY DEVICE

CROSS-REFERENCE TO RELATED APPLICATION

This application is a national stage application of PCT Application No. PCT/CN2022/128723, which is filed on Oct. 31, 2022 and entitled "Display Substrate and Display Device", the content of which should be regarded as being incorporated herein by reference.

TECHNICAL FIELD

The present disclosure relates to, but is not limited to, the field of display technology, in particular to a display substrate and a display device.

BACKGROUND

An Organic Light Emitting Diode (OLED for short) and a Quantum dot Light Emitting Diode (QLED for short) are active light emitting display devices and have advantages such as self-luminescence, a wide viewing angle, a high contrast ratio, low power consumption, an extremely high response speed, lightness and thinness, flexibility, and a low cost. With constant development of display technologies, a flexible display device (Flexible Display) in which an OLED or a QLED is used as a light-emitting device and signal control is performed through a Thin Film Transistor (TFT for short) has become a mainstream product in the field of display at present.

With the development of OLED display technology, consumers have higher and higher requirements for the display effect of display products, and "screen to body ratio" has become an important performance parameter of display devices. Narrow bezel or even full screen display has become a new trend in the development of OLED display products. Therefore, the bezel narrowing or even bezel-less design is getting more and more attention in the design of OLED display products.

SUMMARY

The following is a summary of subject matter described herein in detail. The summary is not intended to limit the protection scope of claims.

In one aspect, the present disclosure provides a display substrate including a display area and a bezel area located on a periphery of the display area, wherein the display area includes a plurality of sub-pixels forming a plurality of pixel rows and a plurality of pixel columns, quantities of sub-pixels in at least part of the pixel columns are reduced in a direction close to the bezel area, a first step-shaped display area boundary is formed on a side of the display area close to the bezel area; the bezel area at least includes a capacitance area, the capacitance area includes a plurality of compensation capacitors forming a second step-shaped capacitance area boundary on a side away from the display area; the display area boundary includes a plurality of first steps connected in sequence, the first steps have a first step length and a first step width, the capacitance area boundary includes a plurality of second steps connected in sequence, the second steps have a second step length and a second step width, the second step length is less than or equal to the first step length, the second step width is less than or equal to the first step width, the first step length and the second step length are dimensions of the first step and the second step in a pixel column direction, respectively, and the first step width and the second step width are dimensions of the first step and the second step in a pixel row direction, respectively.

In an exemplary embodiment, the display area includes a plurality of pixel column groups, at least one pixel column group includes n pixel columns provided in sequence in the pixel row direction, quantities of sub-pixels of at least two pixel columns in the pixel column group are the same, or the quantity of sub-pixels of each pixel column in the pixel column group is different, n is a positive integer greater than or equal to 2; the bezel area includes a plurality of capacitor groups, and at least one capacitor group includes n compensation capacitors provided in sequence in the pixel row direction; and the capacitance groups are provided correspondingly to the pixel column groups.

In an exemplary embodiment, in the at least one capacitor group, at least one compensation capacitor has a bar shape extending in the pixel column direction.

In an exemplary embodiment, in the at least one capacitor group, at least one compensation capacitor at least includes a main body portion and an expansion portion that are connected to each other, the main body portion has a bar shape extending in the pixel column direction, and the expansion portion has a bar shape extending in the pixel row direction.

In an exemplary embodiment, the plurality of capacitor groups at least include a plurality of first capacitor groups and a plurality of second capacitor groups, the plurality of first capacitor groups and the plurality of second capacitor groups being alternately provided in an extending direction of the display area boundary.

In an exemplary embodiment, at least one pixel column group includes a first pixel column, a second pixel column, and a third pixel column provided in sequence in the pixel row direction; at least one first capacitor group includes a first compensation capacitor, a second compensation capacitor and a third compensation capacitor provided in sequence in the pixel row direction, the first compensation capacitor, the second compensation capacitor and the third compensation capacitor being provided on a side of the first pixel column, the second pixel column and the third pixel column in the pixel column direction, respectively; the display substrate has a reference line which is a straight line that bisects the display area in the pixel column direction and extends in the pixel row direction; ends of the first compensation capacitor, the second compensation capacitor and the third compensation capacitor close to the reference line are substantially flush in the pixel row direction, and ends of the first compensation capacitor, the second compensation capacitor and the third compensation capacitor away from the reference line form a second step-shaped capacitance area boundary.

In an exemplary embodiment, a first length of the first compensation capacitor is less than a second length of the second compensation capacitor, the second length of the second compensation capacitor is less than a third length of the third compensation capacitor, a first width of the first compensation capacitor is greater than a second width of the second compensation capacitor, and the second width of the second compensation capacitor is greater than a third width of the third compensation capacitor; the first length, the second length and the third length are maximum dimensions of the first compensation capacitor, the second compensation capacitor and the third compensation capacitor in the pixel column direction, respectively, and the first width, the second width and the third width are maximum dimensions of the first compensation capacitor, the second compensation capacitor and the third compensation capacitor in the pixel row direction, respectively.

In an exemplary embodiment, the first compensation capacitor at least includes a first main body portion and a first expansion portion, a first end of the first main body portion is provided on a side of the first pixel column away from the reference line, a second end of the first main body portion extends in a direction away from the reference line in the pixel column direction, a first end of the first expansion portion is connected with a side of the first main body portion away from the display area, and a second end of the first expansion portion extends in a direction away from the display area in the pixel row direction, so that an end of the first compensation capacitor away from the display area forms a step shape.

In an exemplary embodiment, the first expansion portion at least includes a first sub-portion and a second sub-portion, the first sub-portion is provided on a side of the second sub-portion close to the reference line, first ends of the first sub-portion and the second sub-portion are respectively connected with the side of the first main body portion away from the display area, second ends of the first sub-portion and the second sub-portion extend in the direction away from the display area in the pixel row direction, an extension length of the first sub-portion is greater than an extension length of the second sub-portion, the first sub-portion is located at one end of at least two compensation capacitors in the second capacitor group away from the reference line, and the second sub-portion is located at one end of at least one compensation capacitor in the at least two compensation capacitors away from the reference line.

In an exemplary embodiment, the second compensation capacitor at least includes a second main body portion and a second expansion portion, a first end of the second main body portion is provided on a side of the second pixel column away from the reference line, a second end of the second main body portion extends in a direction away from the reference line in the pixel column direction, a first end of the second expansion portion is connected with a side of the second main body portion away from the display area, a second end of the second expansion portion extends in a direction away from the display area in the pixel row direction, the second expansion portion is located on a side of the first compensation capacitor away from the reference line, and the first compensation capacitor is located on a side of the second main body portion away from the display area, so that an end of the second compensation capacitor away from the display area forms a step shape.

In an exemplary embodiment, the third compensation capacitor at least includes a third main body portion, a first end of the third main body portion is provided on a side of the third pixel column away from the reference line, and a second end of the second main body portion extends in a direction away from the reference line in the pixel column direction.

In an exemplary embodiment, at least one pixel column group includes a first pixel column, a second pixel column, and a third pixel column provided in sequence in the pixel row direction; at least one second capacitor group includes a fourth compensation capacitor, a fifth compensation capacitor and a sixth compensation capacitor provided in sequence in the pixel row direction, the fourth compensation capacitor, the fifth compensation capacitor and the sixth compensation capacitor being provided on a side of the first pixel column, the second pixel column and the third pixel column in the pixel column direction, respectively; the display substrate has a reference line which is a straight line that bisects the display area in the pixel column direction and extends in the pixel row direction; ends of the fourth compensation capacitor, the fifth compensation capacitor and the sixth compensation capacitor close to the reference line are substantially flush in the pixel row direction, and ends of the fourth compensation capacitor, the fifth compensation capacitor and the sixth compensation capacitor away from the reference line form a second step-shaped capacitance area boundary.

In an exemplary embodiment, a fourth length of the fourth compensation capacitor is less than a fifth length of the fifth compensation capacitor, the fifth length of the fifth compensation capacitor is equal to a sixth length of the sixth compensation capacitor, a fourth width of the fourth compensation capacitor is greater than a fifth width of the fifth compensation capacitor, and the fifth width of the fifth compensation capacitor is equal to a sixth width of the sixth compensation capacitor; the fourth length, the fifth length and the sixth length are maximum dimensions of the fourth compensation capacitor, the fifth compensation capacitor and the sixth compensation capacitor in the pixel column direction, respectively, and the fourth width, the fifth width and the sixth width are maximum dimensions of the fourth compensation capacitor, the fifth compensation capacitor and the sixth compensation capacitor in the pixel row direction, respectively.

In an exemplary embodiment, the fourth compensation capacitor at least includes a fourth main body portion and a fourth expansion portion, a first end of the fourth main body portion is provided on a side of the first pixel column away from the reference line, a second end of the fourth main body portion extends in a direction away from the reference line in the pixel column direction, a first end of the fourth expansion portion is connected with a side of the fourth main body portion away from the display area, a second end of the fourth expansion portion extends in a direction away from the display area in the pixel row direction, the fourth expansion portion is located on a side of the first capacitor group away from the reference line, and at least one compensation capacitor in the first capacitor group is located on a side of the fourth main body portion away from the display area, so that an end of the fourth compensation capacitor away from the display area forms a step shape.

In an exemplary embodiment, the fifth compensation capacitor includes at least a fifth main body portion, a first end of the fifth main body portion is provided on a side of the second pixel column away from the reference line, and a second end of the fifth main body portion extends in a direction away from the reference line in the pixel column direction.

In an exemplary embodiment, the sixth compensation capacitor includes at least a sixth main body portion, a first end of the sixth main body portion is provided on a side of the third pixel column away from the reference line, and a second end of the sixth main body portion extends in a direction away from the reference line in the pixel column direction.

In an exemplary embodiment, the bezel area at least includes a first bezel and a second bezel oppositely provided in the pixel row direction, a third bezel and a fourth bezel oppositely provided in the pixel column direction, a first corner portion connecting the first bezel with the third bezel, a second corner portion connecting the second bezel and the third bezel, a third corner portion connecting the first bezel and the fourth bezel, and a fourth corner portion connecting the second bezel and the fourth bezel; and the plurality of compensation capacitors are provided in any one or more of the first corner portion, the second corner portion, the third corner portion, and the fourth corner portion.

In an exemplary embodiment, at least one of the first corner portion and the second corner portion further includes a circuit area provided on a side of the capacitance area away from the display area, the circuit area at least includes a first circuit area and a second circuit area located on a side of the first circuit area away from the display area, the first circuit area is at least provided with a plurality of test circuits, the second circuit area is at least provided with a plurality of gate driving circuits, and the plurality of test circuits and the plurality of gate driving circuits are provided in sequence in an extending direction of the display area boundary.

In an exemplary embodiment, edges of the plurality of test circuits on a side away from the display area form an arcuate first edge line, edges of the plurality of gate driving circuits on a side close to the display area form an arcuate second edge line, and a first distance between the first edge line and the display area boundary is less than a second distance between the second edge line and the display area boundary, the first distance being a minimum distance between the first edge line and the display area boundary, and the second distance being a minimum distance between the second edge line and the display area boundary.

In an exemplary embodiment, at least one of the third corner portion and the fourth corner portion includes a circuit area provided on a side of the display area, the circuit area at least includes a first circuit area and a second circuit area located on a side of the first circuit area away from the display area, the first circuit area is at least provided with a plurality of multiplexing circuits, the second circuit area is at least provided with a plurality of gate driving circuits, and the plurality of multiplexing circuits and the plurality of gate driving circuits are provided in sequence in an extending direction of the display area boundary.

In an exemplary embodiment, edges of the plurality of multiplexing circuits on a side away from the display area form an arcuate third edge line, edges of the plurality of gate driving circuits on a side close to the display area form an arcuate fourth edge line, and a third distance between the third edge line and the display area boundary is less than a fourth distance between the fourth edge line and the display area boundary, the third distance being a minimum distance between the third edge line and the display area boundary, and the fourth distance being a minimum distance between the fourth edge line and the display area boundary.

In an exemplary embodiment, the fourth bezel is at least provided with a plurality of multiplexing circuits, and shapes of the multiplexing circuits located in the fourth bezel and shapes of the multiplexing circuits located in the third corner portion or the fourth corner portion are substantially the same.

In an exemplary embodiment, at least one of the third corner portion, the fourth corner portion, and the fourth bezel is further provided with at least one source output signal line and a plurality of selection signal lines. In the fourth bezel, an orthographic projection of the at least one source output signal line on a display substrate plane and an orthographic projection of the plurality of selection signal lines on the display substrate plane have a first overlapping area. In the third corner portion, an orthographic projection of the at least one source output signal line on the display substrate plane and an orthographic projection of the plurality of selection signal lines on the display substrate plane have a second overlapping area; and the first overlapping area is 0.9*the second overlapping area to 1.1*the second overlapping area, or the second overlapping area is 0.9*the first overlapping area to 1.1*the first overlapping area.

In an exemplary embodiment, the circuit area is further provided with at least one dummy unit, a shape of the dummy unit and a shape of the multiplexing circuit are substantially the same, and the dummy unit is connected with a high voltage power supply trace in the circuit area.

In another aspect, the present disclosure further provides a display substrate including a display area and a bezel area located on a periphery of the display area, wherein the display area includes a plurality of sub-pixels forming a plurality of pixel rows and a plurality of pixel columns, at least one pixel column includes a data signal line and a first power supply line, the bezel area at least includes a plurality of compensation capacitors, at least one compensation capacitor includes a first compensation plate and a second compensation plate, an orthographic projection of the first compensation plate on the display substrate is at least partially overlapped with an orthographic projection of the second compensation plate on the display substrate; on a plane perpendicular to the display substrate, the display substrate includes a base substrate and a first conductive layer, a second conductive layer, a third conductive layer and a fourth conductive layer provided in sequence on the base substrate, the data signal line is provided in the third conductive layer or the fourth conductive layer, the first power supply line is provided in the fourth conductive layer, the first compensation plate and the second compensation plate are provided in two of the first conductive layer to the fourth conductive layer, the first compensation plate is connected with one of the data signal line and the first power supply line, and the second compensation plate is connected with the other of the data signal line and the first power supply line.

In an exemplary embodiment, the at least one compensation capacitor further includes a third compensation plate, an orthographic projection of the third compensation plate on the display substrate is at least partially overlapped with an orthographic projection of the first compensation plate on the display substrate, and an orthographic projection of the third compensation plate on the display substrate is at least partially overlapped with an orthographic projection of the second compensation plate on the display substrate; the third compensation plate is provided between the first compensation plate and the second compensation plate, or the third compensation plate is provided on a side of the first compensation plate away from the second compensation plate, or the third compensation plate is provided on a side of the second compensation plate away from the first compensation plate.

In yet another aspect, the present disclosure further provides a display device, including the aforementioned display substrate.

Other aspects may be understood upon reading and understanding the drawings and detailed description.

BRIEF DESCRIPTION OF DRAWINGS

Accompanying drawings are used for providing understanding of technical solutions of the present disclosure, and form a part of the specification. They are used for explaining the technical solutions of the present disclosure together with embodiments of the present disclosure, but do not form a limitation on the technical solutions of the present disclosure.

DETAILED DESCRIPTION

Figure 1:
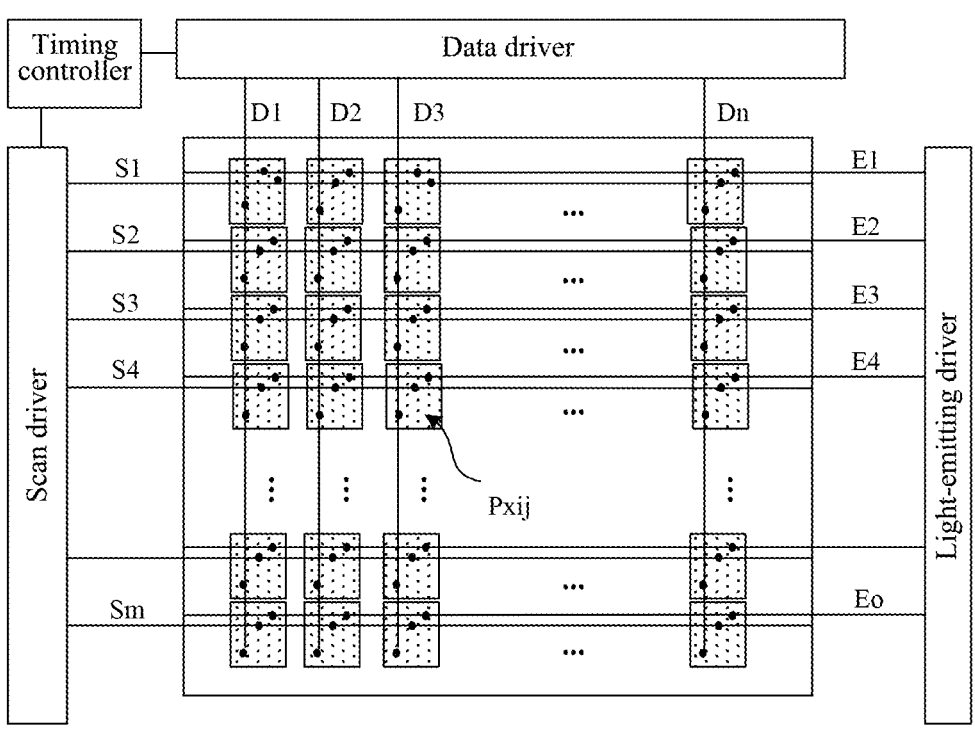
FIG. 1 is a schematic diagram of a structure of a display device.

To make objectives, technical solutions, and advantages of the present disclosure clearer, the embodiments of the present disclosure will be described in detail with reference to the accompanying drawings. It is to be noted that implementations may be practiced in a plurality of different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

Scales of the drawings in the present disclosure may be used as a reference in actual processes, but are not limited thereto. For example, a width-length ratio of a channel, a thickness and spacing of each film layer, and a width and spacing of each signal line may be adjusted according to actual needs. The number of pixels in the display substrate and the number of sub-pixels in each pixel are not limited to the numbers shown in the drawings. The drawings described in the present disclosure are schematic structural diagrams only, and one implementation of the present disclosure is not limited to the shapes, numerical values or the like shown in the drawings.

Ordinal numerals such as "first", "second", and "third" in the specification are set to avoid confusion between constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or an internal communication between two elements. Those of ordinary skills in the art may understand specific meanings of these terms in the present disclosure according to specific situations.

In the specification, a transistor refers to an element which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be a source electrode, and the second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode", as well as the "source terminal" and the "drain terminal", are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be chamfer, arc edge and deformation, etc. In the present disclosure, "about" refers to that a boundary is defined not so strictly and numerical values within process and measurement error ranges are allowed.

FIG. 1 is a schematic diagram of a structure of a display device. As shown in FIG. 1, the display device may include a timing controller, a data driver, a scan driver, a light-emitting driver, and a pixel array, wherein the timing controller is connected with the data driver, the scan driver, and the light-emitting driver, respectively, the data driver is connected with a plurality of data signal lines (D1 to Dn) respectively, the scan driver is connected with a plurality of scan signal lines (S1 to Sm) respectively, and the light-emitting driver is connected with a plurality of light-emitting signal lines (E1 to Eo) respectively. The pixel array may include a plurality of sub-pixels 10xij, wherein both of i and j may be natural numbers. At least one sub-pixel 10xij may include a circuit unit and a light-emitting unit connected with the circuit unit, wherein the circuit unit may at least include a pixel driving circuit that is connected with a scan signal line, a data signal line and a pixel driving circuit, respectively. In an exemplary implementation, the timing controller may provide the data signal driver with a gray-scale value and a control signal which are suitable for a specification of the data signal driver, provide the scan driver with a clock signal and a scan start signal which are suitable for a specification of the scan driver, and provide the light-emitting driver with a clock signal and an emission stop signal which are suitable for a specification of the light-emitting driver. The data driver may generate data voltages to be provided to the data signal lines D1, D2, D3, . . . , and Dn using the grayscale value and the control signal that are received from the timing controller. For example, the data driver may sample the gray-scale value by using the clock signal and apply a data voltage corresponding to the gray-scale value to the data signal lines D1 to Dn by taking a pixel row as a unit, wherein n may be a natural number. The scan driver may generate scan signals to be provided to the scan signal lines S1, S2, S3, . . . , and Sm by receiving the clock signal and the scan start signal from the timing controller. For example, the scan signal driver may sequentially provide a scan signal with an on-level pulse to the scan signal lines S1 to Sm. For example, the scan driver may be configured in a form of a shift register and may generate a scan signal in a manner in which the scan start signal provided in a form of an on-level pulse is transmitted to a circuit in a next stage sequentially under the control of the clock signal, wherein m may be a natural number. The light-emitting driver may receive a clock signal, an emission stop signal, etc., from the timing controller to generate an emission signal to be provided to the light-emitting signal lines E1, E2, E3, . . . , and Eo. For example, the light-emitting driver may provide an emission signal with an off-level pulse to the light-emitting signal lines E1 to Eo sequentially. For example, the light-emitting driver may be constructed in a form of a shift register and may generate an emission signal in a manner in which an emission stop signal provided in a form of an off-level pulse is transmitted to a next-stage circuit sequentially under control of the clock signal, wherein o may be a natural number.

Figure 2:
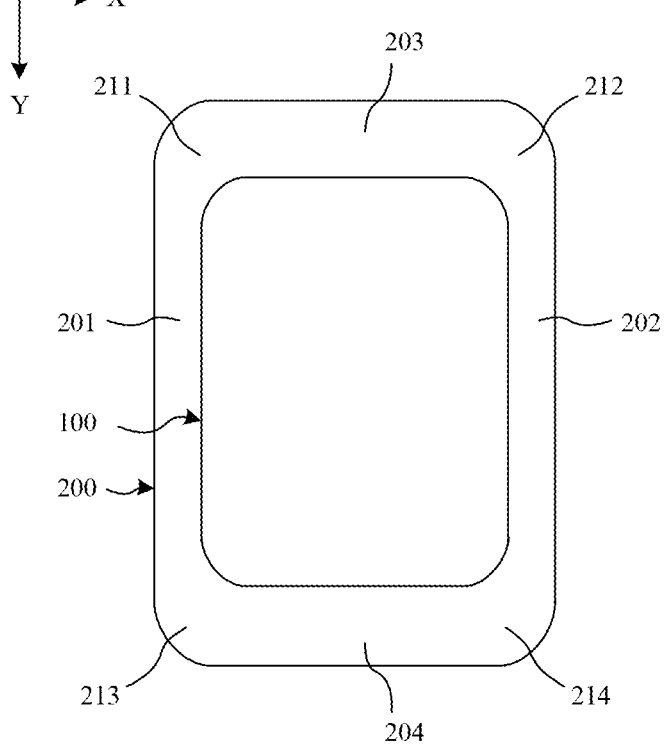
FIG. 2 is a schematic diagram of a planar structure of a display substrate.

FIG. 2 is a schematic diagram of a planar structure of a display substrate, illustrating a rectangular display substrate with rounded chamfers. As shown in FIG. 2, on a plane parallel to the display substrate, the display substrate may include a display area 100 and a bezel area 200 located on a periphery of the display area 100. In an exemplary embodiment, the display area 100 may include a first edge (left edge) and a second edge (right edge) which are oppositely provided in a first direction X, and a third edge (upper edge) and a fourth edge (lower edge) which are oppositely provided in a second direction Y, and adjacent edges are connected by arced chamfers, forming a quadrilateral shape with rounded chamfers.

In an exemplary embodiment, the display area 100 may be a planar area including a plurality of sub-pixels that constitute a pixel array. The plurality of sub-pixels are configured to display a dynamic picture or a still image, and the display area 100 may be referred to as an active area (AA for short). In an exemplary embodiment, the display substrate may be deformable, e.g., may be crimped, bent, folded, or curled.

In an exemplary embodiment, the bezel area 200 may at least include a first bezel (left bezel) 201 and a second bezel (right bezel) 202 oppositely provided in a first direction X, a third bezel (upper bezel) 203 and a fourth bezel (lower bezel) 204 oppositely provided in a second direction Y, a first corner portion 211 connecting the first bezel 201 and the third bezel 203, a second corner portion 212 connecting the second bezel 202 and the third bezel 203, a third corner portion 213 connecting the first bezel 201 and the fourth bezel 204, and a fourth corner portion 214 connecting the second bezel 202 and the fourth bezel 204.

In an exemplary embodiment, the fourth bezel 204 may be referred to as a binding bezel and may include a lead area, a drive chip area, and a bonding pin area provided in sequence in a direction away from the display area 100. The lead area may at least include a plurality of data transmission lines connected with data signal lines of the display area. The driver chip area at least may include an integrated circuit (IC for short) configured to be connected with the plurality of data transmission lines. The bonding pin area may at least include a plurality of bonding pads configured to bond to and connect with an external flexible printed circuit (FPC for short).

In an exemplary embodiment, the first bezel 201 and the second bezel 202 may be referred to as side bezels and may include at least a plurality of cascaded gate driving circuits which may be connected with a scan signal line and a light-emitting signal line in the display area 100, respectively. The third bezel 203 may be referred to as an upper bezel and may at least include a plurality of test circuits connected with data signal lines in the display area 100, respectively.

In an exemplary embodiment, the first corner portion 211 and the second corner portion 212 may include a plurality of gate driving circuits, or may include a plurality of test circuits, or may include a plurality of gate driving circuits and a plurality of test circuits, which is not limited here in the present disclosure.

In an exemplary embodiment, the bezel area 200 may further be provided with a first isolation dam and a second isolation dam, which may extend in a direction parallel to a display area boundary to form a ring structure surrounding the display area 100, and the display area boundary may be an edge of the display area close to the bezel area.

Figure 3:
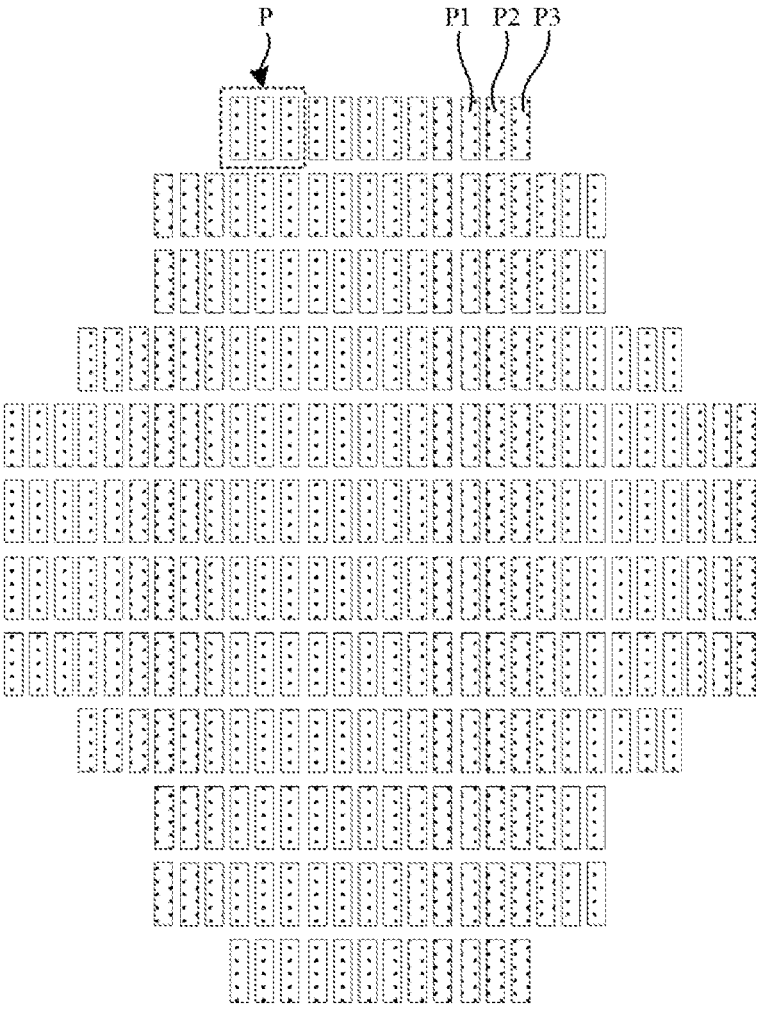
FIG. 3 is a schematic diagram of a planar structure of a display area in a display substrate.

FIG. 3 is a schematic diagram of a planar structure of a display area in a display substrate. As shown in FIG. 3, the display area may include a plurality of pixel units P arranged in a matrix. At least one pixel unit P may include a first sub-pixel P1 emitting light of a first color, a second sub-pixel P2 emitting light of a second color, and a third sub-pixel P3 emitting light of a third color. Each sub-pixel may include a circuit unit and a light-emitting unit, wherein the circuit unit may at least include a pixel driving circuit connected with a scan signal line, a data signal line, and a light-emitting signal line, respectively, and configured to receive a data voltage transmitted by the data signal line and output a corresponding current to the light-emitting unit under control of the scan signal line and the light-emitting signal line. The light-emitting unit in each sub-pixel is connected with a pixel driving circuit of a sub-pixel where the light-emitting unit is located, and is configured to emit light with corresponding brightness in response to a current output by the pixel driving circuit connected with the light-emitting unit.

In an exemplary embodiment, the first sub-pixel P1 may be a red sub-pixel (R) emitting red light, the second sub-pixel P2 may be a blue sub-pixel (B) emitting blue light, and the third sub-pixel P3 may be a green sub-pixel (G) emitting green light. In an exemplary embodiment, a sub-pixel may be in a shape of a rectangle, a rhombus, a pentagon, or a hexagon. Three sub-pixels may be provided side by side horizontally, side by side vertically, or in a manner like a Chinese character "品". In an exemplary embodiment, the pixel unit may include three sub-pixels, which may be arranged side by side horizontally, side by side vertically, in a square, in a diamond shape, or the like, which is not limited here in the present disclosure.

In an exemplary embodiment, taking a pixel unit including three sub-pixels arranged side by side horizontally as an example, the plurality of sub-pixels of the display area may form a plurality of pixel rows and a plurality of pixel columns, the pixel row may include a plurality of sub-pixels arranged in sequence in a first direction X, the plurality of pixel rows may be arranged in sequence in a second direction Y, the pixel column may include a plurality of sub-pixels arranged in sequence in the second direction Y, and the plurality of pixel columns may be arranged in sequence in the first direction X. In an exemplary embodiment, the first direction X may be a pixel row direction, the second direction Y may be a pixel column direction, and the first direction X and the second direction Y may be perpendicular to each other.

In an exemplary embodiment, for a rectangular display substrate with rounded chamfers, quantities of sub-pixels in the plurality of pixel columns are different, the quantity of sub-pixels in a pixel column close to a side bezel is smaller, and the quantity of sub-pixels in a pixel column located at a middle of the display area is larger. That is, the quantities of sub-pixels in the pixel columns in a direction close to the bezel area are gradually reduced, so that a side of the display area close to the bezel area forms a first step-shaped display area boundary.

Figure 4:
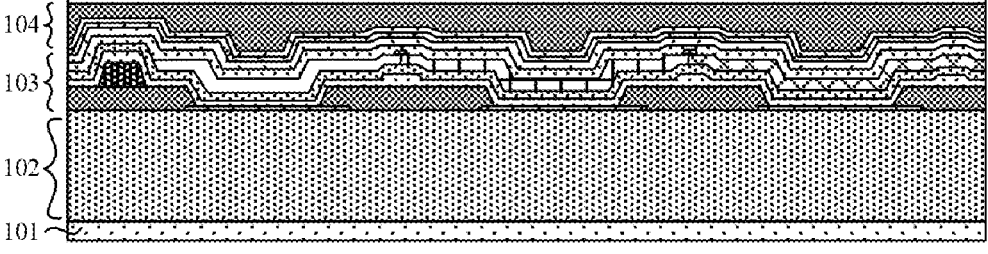
FIG. 4 is a schematic diagram of a sectional structure of a display area in a display substrate.

FIG. 4 is a schematic diagram of a sectional structure of a display area in a display substrate, illustrating a structure of three sub-pixels in the display area. As shown in FIG. 4, in a plane perpendicular to the display substrate, the display substrate may include a driving circuit layer 102 provided on a base substrate 101, a light-emitting structure layer 103 provided at a side of the driving circuit layer 102 away from the base substrate 101, and an encapsulation structure layer 104 provided at a side of the light-emitting structure layer 103 away from the base substrate 101. In some possible implementations, the display substrate may include other film layers, such as a touch structure layer, which is not limited here in the present disclosure.

In an exemplary embodiment, the base substrate 101 may be a flexible base substrate, or a rigid base substrate. The driving circuit layer 102 may include a plurality of circuit units, and the circuit unit may at least include a pixel driving circuit. The light-emitting structure layer 103 may at least include a plurality of light-emitting units, and each of the light-emitting units at least includes an anode, an organic light-emitting layer and a cathode, wherein the organic light-emitting layer is driven by the anode and the cathode to emit light of a corresponding color. The encapsulation structure layer 104 may include a first encapsulation layer, a second encapsulation layer, and a third encapsulation layer that are stacked, wherein the first encapsulation layer and the third encapsulation layer may be made of an inorganic material, the second encapsulation layer may be made of an organic material, and the second encapsulation layer is provided between the first encapsulation layer and the third encapsulation layer to form an inorganic material/organic material/inorganic material laminated structure and ensure that external water and oxygen cannot enter the light-emitting structure layer 103.

Figure 5:
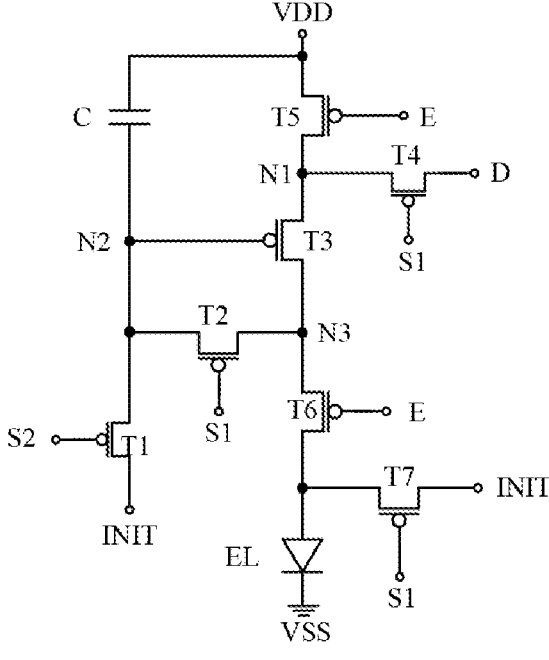
FIG. 5 is a schematic diagram of an equivalent circuit of a pixel driving circuit.

FIG. 5 is a schematic diagram of an equivalent circuit of a pixel driving circuit. In an exemplary implementation, the pixel driving circuit may have a structure of 3T1C, 4T1C, 5T1C, 5T2C, 6T1C, 7T1C, or 8T1C. As shown in FIG. 5, the pixel driving circuit may include seven transistors (a first transistor T1 to a seventh transistor T7), and one storage capacitor C. The pixel driving circuit is connected with six signal lines (a data signal line D, a first scan signal line S1, a second scan signal line S2, a light-emitting signal line E, an initial signal line INIT, and a first power supply line VDD) respectively.

In an exemplary embodiment, the pixel driving circuit may include a first node N1, a second node N2, and a third node N3. Herein, the first node N1 is respectively connected with a first electrode of the third transistor T3, a second electrode of the fourth transistor T4, and a second electrode of the fifth transistor T5, the second node N2 is respectively connected with a second electrode of the first transistor, a first electrode of the second transistor T2, a gate electrode of the third transistor T3, and a second end of the storage capacitor C, and the third node N3 is respectively connected with a second electrode of the second transistor T2, a second electrode of the third transistor T3, and a first electrode of the sixth transistor T6.

In an exemplary embodiment, a first end of the storage capacitor C is connected with the first power supply line VDD, and a second end of the storage capacitor C is connected with a second node N2, namely the second end of the storage capacitor C is connected with a gate electrode of the third transistor T3.

A gate electrode of the first transistor T1 is connected with the second scan signal line S2, a first electrode of the first transistor T1 is connected with the initial signal line INIT, and a second electrode of the first transistor is connected with the second node N2. When a scan signal with an on-level is applied to the second scan signal line S2, the first transistor T1 transmits an initialization voltage to the gate electrode of the third transistor T3 so as to initialize a charge amount of the gate electrode of the third transistor T3.

A gate electrode of the second transistor T2 is connected to the first scan signal line S1, a first electrode of the second transistor T2 is connected to the second node N2, and a second electrode of the second transistor T2 is connected to a third node N3. When a scan signal with an on-level is applied to the first scan signal line S1, the second transistor T2 enables the gate electrode of the third transistor T3 to be connected with a second electrode of the third transistor T3.

The gate electrode of the third transistor T3 is connected with the second node N2, namely the gate electrode of the third transistor T3 is connected with the second end of the storage capacitor C, a first electrode of the third transistor T3 is connected with a first node N1, and the second electrode of the third transistor T3 is connected with the third node N3. The third transistor T3 may be referred to as a drive transistor, and the third transistor T3 determines an amount of a drive current flowing between the first power supply line VDD and the second power supply line VSS according to a potential difference between the gate electrode and the first electrode of the third transistor T3.

A gate electrode of the fourth transistor T4 is connected to the first scan signal line S1, a first electrode of the fourth transistor T4 is connected to the data signal line D, and a second electrode of the fourth transistor T4 is connected to the first node N1. The fourth transistor T4 may be referred to as a switching transistor, a scan transistor, etc., and when a scan signal with an on-level is applied to the first scan signal line S1, the fourth transistor T4 enables a data voltage of the data signal line D to be input to the pixel driving circuit.

A gate electrode of the fifth transistor T5 is connected with the light-emitting signal line E, a first electrode of the fifth transistor T5 is connected with the first power supply line VDD, and a second electrode of the fifth transistor T5 is connected with the first node N1. A gate electrode of the sixth transistor T6 is connected with the light-emitting signal line E, a first electrode of the sixth transistor T6 is connected with the third node N3, and a second electrode of the sixth transistor T6 is connected with a first electrode of the light-emitting unit EL. The fifth transistor T5 and the sixth transistor T6 may be referred to as light-emitting transistors. When a light-emitting signal with an on-level is applied to the light-emitting signal line E, the fifth transistor T5 and the sixth transistor T6 enable the light emitting unit EL to emit light by forming a drive current path between the first power supply line VDD and the second power supply line VSS.

A gate electrode of the seventh transistor T7 is connected with the second scan signal line S2, a first electrode of the seventh transistor T7 is connected with the initial signal line INIT, and a second electrode of the seventh transistor T7 is connected with the first electrode of the light-emitting unit EL. When a scan signal with an on-level is applied to the second scan signal line S2, the seventh transistor T7 transmits an initialization voltage to the first electrode of the light-emitting unit EL so as to initialize a charge amount accumulated in the first electrode of the light-emitting unit EL or release a charge amount accumulated in the first electrode of the light-emitting unit EL.

In an exemplary embodiment, the light-emitting unit EL may be an OLED including a first electrode (anode), an organic light emitting layer, and a second electrode (cathode) which are stacked, or may be a QLED including a first electrode (anode), a quantum dot light emitting layer, and a second electrode (cathode) which are stacked.

In an exemplary embodiment, a second electrode of the light-emitting unit EL is connected with the second power supply line VSS, a signal of the second power supply line VSS is a low-level signal continuously provided, and a signal of the first power supply line VDD is a high-level signal continuously provided.

In an exemplary embodiment, the first transistor T1 to the seventh transistor T7 may be P-type transistors, or may be N-type transistors. Use of the same type of transistors in the pixel driving circuit may simplify a process flow, reduce the process difficulty of a display panel, and improve the product yield. In some possible implementations, the first transistor T1 to the seventh transistor T7 may include P type transistors and N type transistors.

In an exemplary embodiment, for the first transistor T1 to the seventh transistor T7, low temperature poly-silicon thin film transistors may be adopted, or oxide thin film transistors may be adopted, or both a low temperature poly-silicon thin film transistor and an oxide thin film transistor may be adopted. An active layer of a low temperature poly-silicon thin film transistor may be made of Low Temperature Poly-Silicon (LTPS for short), and an active layer of an oxide thin film transistor may be made of an oxide semiconductor (Oxide). The low temperature poly-silicon thin film transistor has advantages such as high migration rate and fast charging. The oxide thin film transistor has advantages such as low drain current. The low temperature poly-silicon thin film transistor and the oxide thin film transistor are integrated on one display substrate to form a Low Temperature Polycrystalline Oxide (LTPO for short) display substrate, so that advantages of the low temperature poly-silicon thin film transistor and the oxide thin film transistor can be utilized, low-frequency drive can be realized, power consumption can be reduced, and display quality can be improved.

Taking all of the seven transistors being P-type transistors as an example, the operation process of the pixel driving circuit may include the following stages.

In a first stage (referred to as a reset stage), a signal of the second scan signal line S2 is a low-level signal, and signals of the first scan signal line S1 and the light-emitting signal line E are high-level signals. The signal of the second scan signal line S2 is a low-level signals, which causes the first transistor T1 and the seventh transistor T7 to be turned on. The first transistor T1 is turned on such that the initial voltage of the initial signal line INIT is provided to a second node N2 to initialize the storage capacitor C to clear an original data voltage in the storage capacitor. The seventh transistor T7 is turned on such that an initialization voltage of the initial signal line INIT is provided to a first electrode of the OLED to initialize (reset) the first electrode of the OLED and clear a pre-stored voltage therein, thereby completing initialization. The signals of the first scan signal line S1 and the light-emitting signal line E are high-level signals, so that the second transistor T2, the fourth transistor T4, the fifth transistor T5 and the sixth transistor T6 are turned off. The OLED does not emit light in this stage.

In a second stage (referred to as a data writing stage or a threshold compensation stage), a signal of the first scan signal line S1 is a low-level signal, signals of the second scan signal line S2 and the light-emitting signal line E are high-level signals, and the data signal line D outputs a data voltage. In this stage, the second end of the storage capacitor C is at a low level, so the third transistor T3 is turned on. The signal of the first scan signal line S1 is a low-level signal, so that the second transistor T2 and the fourth transistor T4 are turned on. The second transistor T2 and the fourth transistor T4 are turned on, so that the data voltage output by the data signal line D is provided to the second node N2 through the first node N1, the turned-on third transistor T3, the third node N3 and the turned-on second transistor T2, and a difference between the data voltage output by the data signal line D and a threshold voltage of the third transistor T3 is charged into the storage capacitor C. A voltage of the second end (the second node N2) of the storage capacitor C is Vd−|Vth|, where Vd is the data voltage output by the data signal line D, and Vth is the threshold voltage of the third transistor T3. A signal of the second scan signal line S2 is a high-level signal, so that the first transistor T1 and the seventh transistor T7 are turned off. A signal of the light-emitting signal line E is a high-level signal, so that the fifth transistor T5 and the sixth transistor T6 are turned off.

In a third stage (referred to as a light-emitting stage), a signal of the light-emitting signal line E is a low-level signal, and signals of the first scan signal line S1 and the second scan signal line S2 are high-level signals. The signal of the light-emitting signal line E is the low-level signal, so that the fifth transistor T5 and the sixth transistor T6 are turned on, and a power voltage output by the first power supply line VDD provides a drive voltage to the first electrode of the OLED through the turned-on fifth transistor T5, the third transistor T3, and the sixth transistor T6 to drive the OLED to emit light.

In a drive process of the pixel driving circuit, a drive current flowing through the third transistor T3 (drive transistor) is determined by a voltage difference between the gate electrode and the first electrode of the third transistor T3. Since the voltage of the second node N2 is Vd−|Vth|, the drive current of the third transistor T3 is:

$$I = K*(Vgs - Vth)^2 = K*[(Vdd - Vd + |Vth|) - Vth]^2 = K*[Vdd - Vd]^2$$

where I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

According to the rectangular display substrate with rounded chamfers, such as a wearable watch and other products, since an area from the first corner portion to the fourth corner portion is larger, the quantities of sub-pixels in the plurality of pixel columns in the display area are different, and the quantities of sub-pixels in the pixel columns in a direction close to the bezel area is gradually reduced, so that the extension length of data signal lines in the display area is greatly different, resulting in the difference of data voltage load and affecting the display effect. In order to reduce the difference of data voltage load in the display area, the existing structure usually adopts a compensation capacitor, which reduces the difference of data voltage load by providing a compensation capacitor in the bezel area and realizes the optimized display effect. According to the research of the inventor of the present application, the existing structure provided with a compensation capacitor occupies a large area of the bezel area, which leads to the increase of the bezel width and is not conducive to the realization of a narrow bezel.

In order to effectively reduce the area of the bezel area occupied by the compensation capacitor and realize the narrowing of the bezel, an exemplary embodiment of the present disclosure provides a display substrate. In an exemplary embodiment, the display substrate may include a display area and a bezel area located on a periphery of the display area, wherein the display area may include a plurality of sub-pixels forming a plurality of pixel rows and a plurality of pixel columns, a quantity of sub-pixels in at least part of the pixel columns is reduced in a direction close to the bezel area, a first step-shaped display area boundary is formed on a side of the display area close to the bezel area; the bezel area at least includes a capacitance area, the capacitance area includes a plurality of compensation capacitors forming a second step-shaped capacitance area boundary on a side away from the display area; the display area boundary includes a plurality of first steps connected in sequence, the first steps have a first step length and a first step width, the capacitance area boundary includes a plurality of second steps connected in sequence, the second steps have a second step length and a second step width, the second step length is less than or equal to the first step length, the second step width is less than or equal to the first step width, the first step length and the second step length are dimensions of the first step and the second step in a pixel column direction, respectively, and the first step width and the second step width are dimensions of the first step and the second step in a pixel row direction, respectively.

In an exemplary embodiment, the display area includes a plurality of pixel column groups, at least one pixel column group includes n pixel columns provided in sequence in the pixel row direction, quantities of sub-pixels of at least two pixel columns in the pixel column group are the same, or the quantity of sub-pixels of each pixel column in the pixel column group is different, n is a positive integer greater than or equal to 2; the bezel area includes a plurality of capacitor groups, and at least one capacitor group includes n compensation capacitors provided in sequence in the pixel row direction; and the capacitance groups are provided correspondingly to the pixel column groups.

In an exemplary embodiment, in the at least one capacitor group, at least one compensation capacitor has a bar shape extending in the pixel column direction.

In an exemplary embodiment, in the at least one capacitor group, at least one compensation capacitor at least includes a main body portion and an expansion portion that are connected to each other, the main body portion has a bar shape extending in the pixel column direction, and the expansion portion has a bar shape extending in the pixel row direction.

In an exemplary embodiment, the plurality of capacitor groups at least include a plurality of first capacitor groups and a plurality of second capacitor groups, the plurality of first capacitor groups and the plurality of second capacitor groups being alternately provided in an extending direction of the display area boundary.

In an exemplary embodiment, at least one pixel column group includes a first pixel column, a second pixel column, and a third pixel column provided in sequence in the pixel row direction; at least one first capacitor group includes a first compensation capacitor, a second compensation capacitor, and a third compensation capacitor provided in sequence in the pixel row direction, the first compensation capacitor, the second compensation capacitor, and the third compensation capacitor being provided on a side of the first pixel column, the second pixel column, and the third pixel column in the pixel column direction, respectively; the display substrate includes a reference line which is a straight line bisecting the display area in the pixel column direction and extending in the pixel row direction; ends of the first compensation capacitor, the second compensation capacitor and the third compensation capacitor close to the reference line are substantially flush in the pixel row direction, and ends of the first compensation capacitor, the second compensation capacitor and the third compensation capacitor away from the reference line form a second step-shaped capacitance area boundary.

In an exemplary embodiment, at least one second capacitor group includes a fourth compensation capacitor, a fifth compensation capacitor, and a sixth compensation capacitor provided in sequence in the pixel row direction, the fourth compensation capacitor, the fifth compensation capacitor, and the sixth compensation capacitor being provided on a side of the first pixel column, the second pixel column and the third pixel column in the pixel column direction, respectively; ends of the fourth compensation capacitor, the fifth compensation capacitor and the sixth compensation capacitor close to the reference line are substantially flush in the pixel row direction, and ends of the fourth compensation capacitor, the fifth compensation capacitor and the sixth compensation capacitor away from the reference line form a second step-shaped capacitance area boundary.

In an exemplary embodiment, at least one pixel column includes a data signal line and a first power supply line, at least one compensation capacitor includes a first plate and a second plate, an orthographic projection of the first plate on the display substrate is at least partially overlapped with an orthographic projection of the second plate on the display substrate, the first plate is connected with the data signal line in the pixel column, and the second plate is connected with the first power supply line in the pixel column.

In an exemplary embodiment, the bezel area at least includes a first bezel and a second bezel oppositely provided in the pixel row direction, a third bezel and a fourth bezel oppositely provided in the pixel column direction, a first corner portion connecting the first bezel with the third bezel, a second corner portion connecting the second bezel and the third bezel, a third corner portion connecting the first bezel and the fourth bezel, and a fourth corner portion connecting the second bezel and the fourth bezel; the plurality of compensation capacitors are provided in any one or more of the first corner portion, the second corner portion, the third corner portion, and the fourth corner portion.

Figure 6:
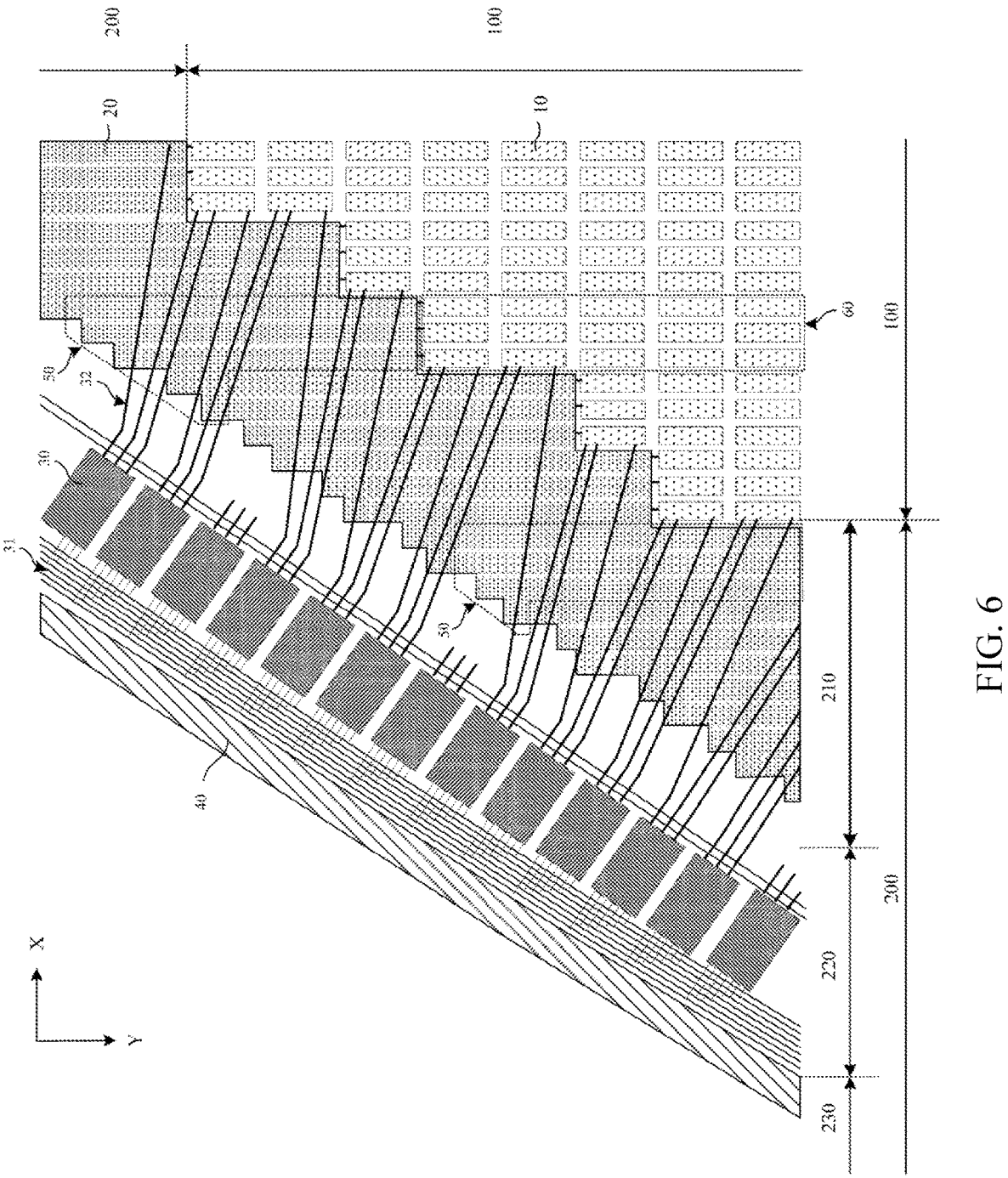
FIG. 6 is a schematic diagram of a planar structure of a display substrate according to an exemplary embodiment of the present disclosure.

FIG. 6 is a schematic diagram of a planar structure of a display substrate according to an exemplary embodiment of the present disclosure. In an exemplary embodiment, the display substrate may include a display area 100 and a bezel area 200 located on a periphery of the display area 100. In an exemplary embodiment, the display area 100 may include at least a plurality of sub-pixels 10 forming a plurality of pixel rows and a plurality of pixel columns, the pixel row may include a plurality of sub-pixels 10 arranged in sequence in a first direction X, the pixel column may include a plurality of sub-pixels 10 arranged in sequence in a second direction Y, the plurality of pixel columns may be arranged in sequence in the first direction X to form a pixel array in the display area 100, the first direction X may be a pixel row direction, the second direction Y may be a pixel column direction, and the first direction X and the second direction Y may be perpendicular to each other. In an exemplary embodiment, the bezel area 200 may at least include a first bezel, a second bezel, a third bezel, a fourth bezel, a first corner portion, a second corner portion, a third corner portion, and a fourth corner portion; the first bezel and the second bezel may be oppositely provided in the first direction X, the third bezel and the fourth bezel may be oppositely provided in the second direction Y; the first corner portion may be provided between the first bezel and the third bezel and connected with the first bezel and the third bezel respectively, the second corner portion may be provided between the second bezel and the third bezel and connected with the second bezel and the third bezel respectively, the third corner portion may be provided between the first bezel and the fourth bezel and connected with the first bezel and the fourth bezel respectively, and the fourth corner portion may be provided between the second bezel and the fourth bezel and connected with the second bezel and the fourth bezel respectively; and edges of the first corner portion, the second corner portion, the third corner portion and the fourth corner portion on a side close to the display area and edges thereof on a side away from the display area are in an arc shape. FIG. 6 illustrates a structure in which a compensation capacitor is provided in the first corner portion.

In an exemplary embodiment, the compensation capacitor may include a first compensation plate and a second compensation plate stacked on the base substrate, an orthographic projection of the second compensation plate on the base substrate is at least partially overlapped with an orthographic projection of the first compensation plate on the base substrate, the first compensation plate is configured to be connected with the data signal line in the display area, and the second compensation plate is configured to be connected with the first power supply line in the display area. In an exemplary embodiment, the first compensation plates of the plurality of compensation capacitors may be provided at intervals and the second compensation plates of the plurality of compensation capacitors may be connected with each other to form an integral structure.

Figure 7A:
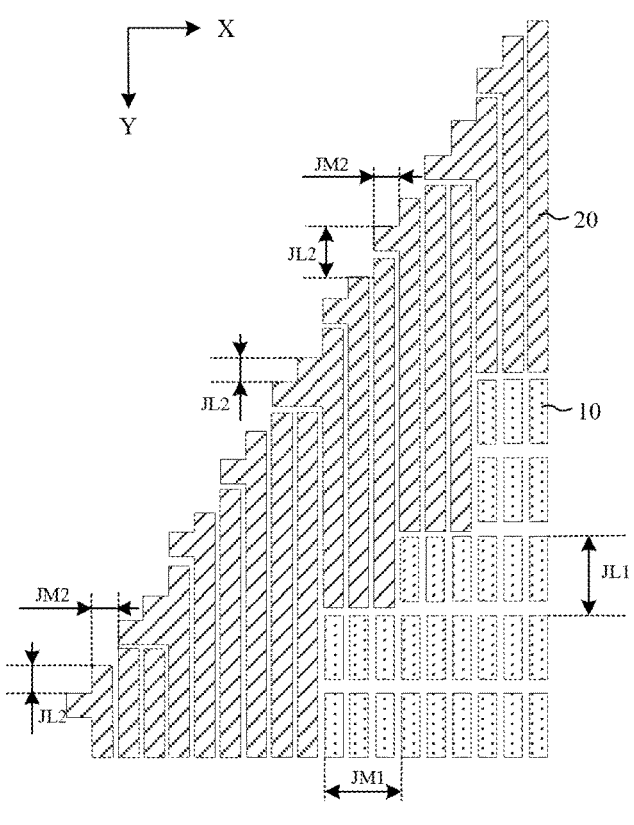
FIGS. 7A and 7B are enlarged views of the capacitance area of FIG. 6.
Figure 7B:
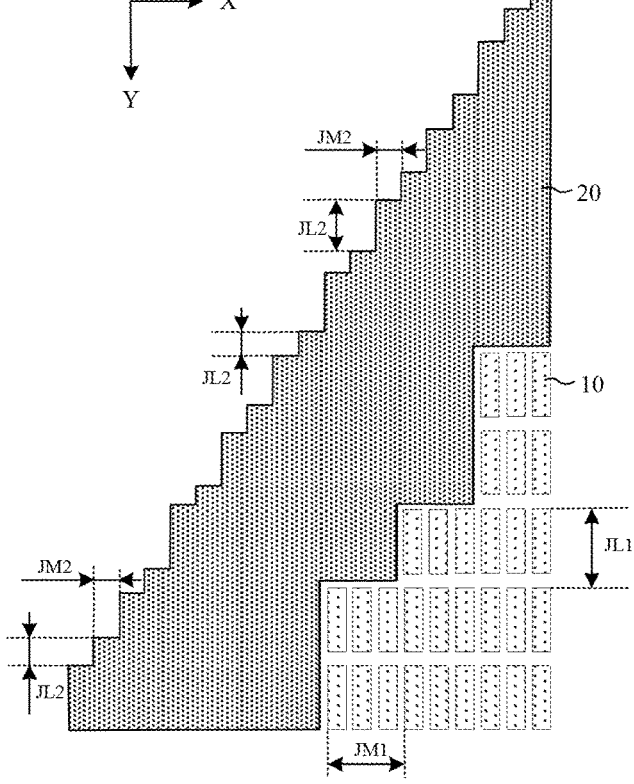

FIGS. 7A and 7B are enlarged views of the capacitance area of FIG. 6, wherein FIG. 7A illustrates a structure of a first compensation plate in a compensation capacitor, and FIG. 7B illustrates a structure of a second compensation plate in a compensation capacitor. As shown in FIGS. 6, 7A and 7B, quantities of sub-pixels 10 of a plurality of pixel columns in the display area 100 may be different, and the quantities of sub-pixels 10 in the pixel column in a direction of the bezel area 200 may be gradually reduced, so that the display area boundary on a side of the display area 100 close to the bezel area 200 forms a first step shape. In an exemplary embodiment, the first step-shaped display area boundary may include a plurality of first steps connected in sequence, the first step having a first step length JL1 that may be a size of the first step in the second direction Y (pixel column direction) and a first step width JM1 that may be a size of the first step in the first direction X (pixel row direction).

In an exemplary embodiment, the bezel area 200 may at least include a capacitance area 210, a circuit area 220 and a trace area 230 which are provided in sequence in a direction away from the display area 100. The capacitance area 210 is provided at least with a plurality of compensation capacitors 20, the circuit area 220 is provided at least with a plurality of gate driving circuits 30, and the trace area 230 is provided at least with a low voltage power supply trace 40.

In an exemplary embodiment, the compensation capacitor 20 may have a bar shape extending in the second direction Y, and the plurality of compensation capacitors 20 may be respectively provided on one side or both sides of the plurality of pixel columns in the second direction Y, and the compensation capacitors 20 are configured to provide compensation to the data signal lines of the display area 100. As for the plurality of compensation capacitors 20 provided in the first corner portion, the plurality of compensation capacitors 20 may be respectively provided on a side of the plurality of pixel columns in an opposite direction of the second direction Y, and one compensation capacitor 20 is provided on a side of one pixel column in an opposite direction of the second direction Y.

In an exemplary embodiment, the gate driving circuit 30 may have a rectangular shape, a plurality of gate driving circuits 30 may be provided in sequence in an extending direction of the display area boundary, input ends of the plurality of gate driving circuits 30 are respectively connected with a plurality of gate signal lines 31 through a connection line, output ends of the plurality of gate driving circuits 30 are respectively connected with the scan signal lines and the light-emitting signal lines in the plurality of pixel rows in the display area 100 through a gate output line 32, and the gate driving circuit 30 is configured to supply a scan signal and a light-emitting signal to the scan signal line and the light-emitting signal line of the display area 100. In an exemplary embodiment, the plurality of gate signal lines 31 may have a bar shape extending in an extending direction of the display area boundary, and the plurality of gate signal lines 31 may be provided on a side of the plurality of gate driving circuits 30 away from the display area.

In an exemplary embodiment, the low voltage power supply trace 40 may have a bar shape extending along an extending direction of the display area boundary, the low voltage power supply traces 40 may be provided on a side of the plurality of gate signal lines 31 away from the display area, and the low voltage power supply traces 40 are configured to supply a low-voltage power supply signal to a light-emitting device of the display area 100.

In an exemplary embodiment, the plurality of compensation capacitors 20 in the capacitance area 210 are provided in a interlaced manner, so that the plurality of compensation capacitors 20 form a second step shape in the capacitance area boundary on a side away from the display area. In an exemplary embodiment, the second step-shaped capacitance area boundary may include a plurality of second steps connected in sequence, the second step having a second step length JL2 that may be a size of the second step in the second direction Y (pixel column direction) and a second step width JM2 that may be a size of the second step in the first direction X (pixel row direction).

In an exemplary embodiment, the second step length JL2 may be less than or equal to the first step length JL1, and the second step width JM2 may be less than or equal to the first step width JM1. That is, the first step of the boundary of the capacitance area has a smaller step size relative to the second step of the boundary of the display area. In an exemplary embodiment, the first step length JL1 may be the largest first step length among the plurality of first steps, the first step width JM1 may be the largest first step width among the plurality of first steps, the second step length JL2 may be the smallest second step length among the plurality of second steps, and the second step width JM2 may be the smallest second step width among the plurality of second steps.

In an exemplary embodiment, JL2=0.2*JL1 to 0.4*JL1, and JM2=0.2*JM1 to 0.4*JM1. For example, JL2=JL1/3, and JM2=JM1/3. The present disclosure may effectively reduce the occupied area of the capacitance area and the width of the bezel area by forming the capacitance area boundary with a smaller step size, thereby realizing the narrowing of the bezel.

In an exemplary embodiment, the plurality of pixel columns of the display area 100 may be divided into a plurality of pixel column groups 60, each of which may include n pixel columns provided in sequence in the first direction X, quantities of sub-pixels in the n pixel columns are the same, and n may be a positive integer greater than or equal to 2. The plurality of compensation capacitors 20 of the bezel area 200 may be divided into a plurality of capacitor groups 50, each of which may include n compensation capacitors 20 provided in sequence in the first direction X, and capacitance values of the n compensation capacitors 20 are substantially equal or substantially the same. In an exemplary embodiment, at least one capacitor group 50 is provided correspondingly to at least one pixel column group 60, and the at least one capacitor group 50 may be provided on one side or both sides of the at least one pixel column group 60 in the second direction Y. For the compensation capacitors that are provided in the first corner portion, a capacitor group 50 is provided on a side of a pixel column group 60 in an opposite direction of the second direction Y. In an exemplary embodiment, the capacitance values of the compensation capacitors are substantially equal, meaning that areas of the first compensation plates (or areas of orthographic projections on the base substrate) in the compensation capacitors are substantially the same.

In an exemplary embodiment, n may be a quantity of sub-pixels included in one pixel unit. For example, if a pixel unit includes a first sub-pixel, a second sub-pixel, and a third sub-pixel, a pixel column group 60 may include a first pixel column, a second pixel column, and a third pixel column provided in sequence in the first direction X. The first pixel column may include a plurality of first sub-pixels arranged in the second direction Y, the second pixel column may include a plurality of second sub-pixels arranged in the second direction Y, and the third pixel column may include a plurality of third sub-pixels arranged in the second direction Y. The first pixel column, the second pixel column, and the third pixel column have the same quantity of sub-pixels, i.e., edges on both sides of the three pixel columns in the second direction Y are substantially flush.

Figure 8:
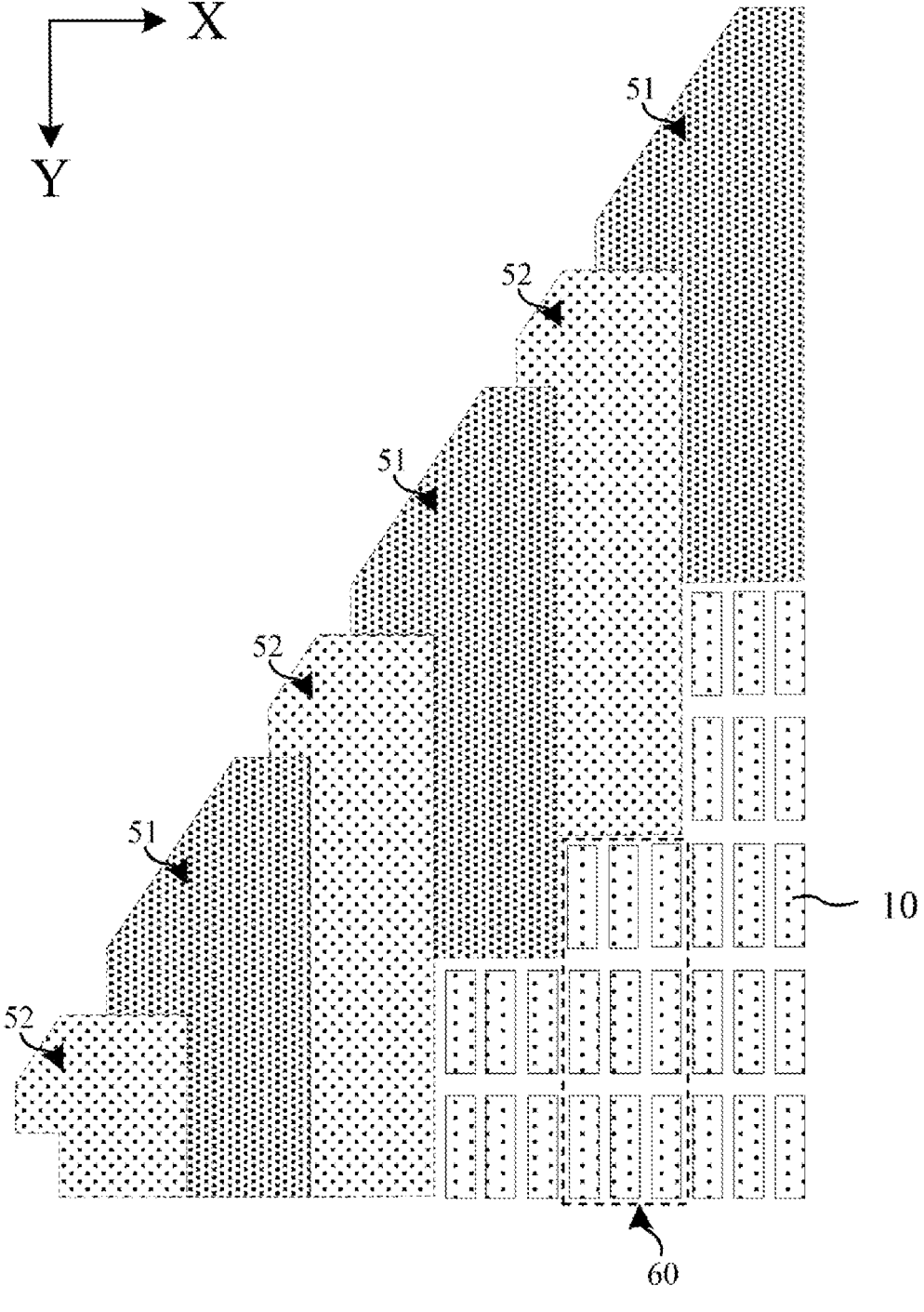
FIG. 8 is an arrangement diagram of a capacitor group according to an exemplary embodiment of the present disclosure.

FIG. 8 is an arrangement diagram of a capacitor group according to an exemplary embodiment of the present disclosure. As shown in FIG. 8, in an exemplary embodiment, the plurality of capacitor groups 50 may at least include a plurality of first capacitor groups 51 and a plurality of second capacitor groups 52, which may be alternately provided in the extending direction of the display area boundary, i.e., a second capacitor group 52 is provided between two adjacent first capacitor groups 51 and a first capacitor group 51 is provided between two adjacent second capacitor groups 52.

In an exemplary embodiment, the quantity of compensation capacitors included in the first capacitor group 51 and the quantity of compensation capacitors included in the second capacitor group 52 may be the same or may be different. By alternately providing the first capacitor groups 51 and the second capacitor groups 52 in the present disclosure, the edges of the plurality of capacitor groups on a side away from the display area may be substantially located on a straight line extending in the extending direction of the boundary of the display area.

Figure 9:
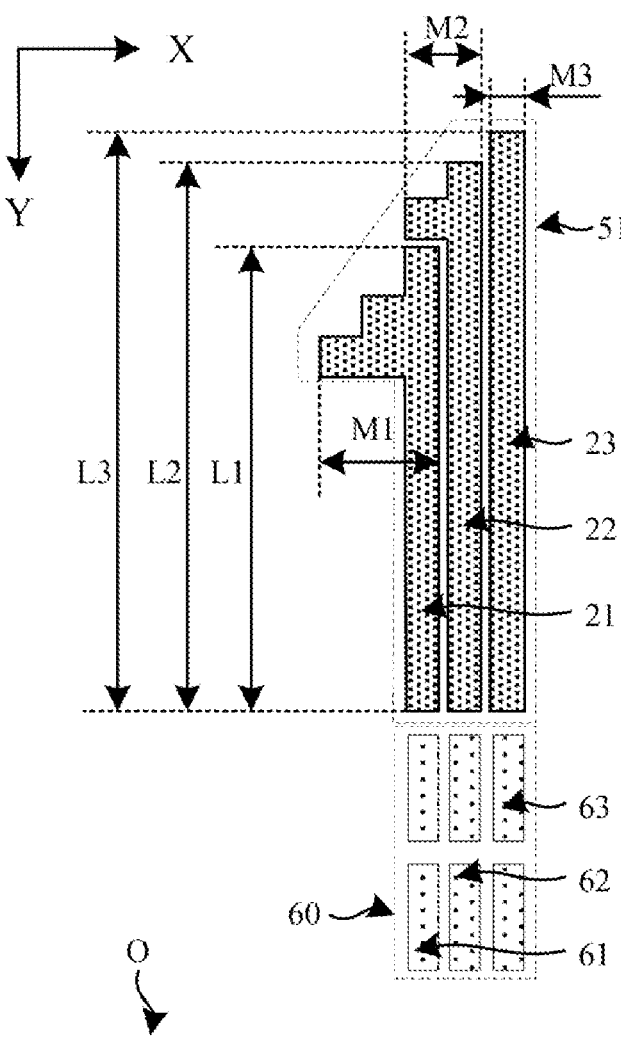
FIG. 9 is a schematic diagram of a structure of a first capacitor group according to an exemplary embodiment of the present disclosure.

FIG. 9 is a schematic diagram of a structure of a first capacitor group according to an exemplary embodiment of the present disclosure. In an exemplary embodiment, the display substrate may have a reference line O, which may be a straight line that bisects the display area in the second direction Y (pixel column direction) and extends in the first direction X (pixel row direction). As shown in FIG. 9, a pixel column group 60 may include a first pixel column 61, a second pixel column 62, and a third pixel column 63 provided in sequence in the first direction X, and a first capacitor group 51 may include a first compensation capacitor 21, a second compensation capacitor 22, and a third compensation capacitor 23 provided in sequence in the first direction X. The first capacitor group 51 may be provided on a side of the pixel column group 60 away from the reference line O.

In an exemplary embodiment, an orthographic projection of the first compensation capacitor 21 on the reference line O may be at least partially overlapped with an orthographic projection of the first pixel column 61 on the reference line O, an orthographic projection of the second compensation capacitor 22 on the reference line O may be at least partially overlapped with an orthographic projection of the second pixel column 62 on the reference line O, and an orthographic projection of the third compensation capacitor 23 on the reference line O may be at least partially overlapped with an orthographic projection of the third pixel column 63 on the reference line O. In an exemplary embodiment, positional relationship and dimensional parameters of the compensation capacitor in the present disclosure refer to the positional relationship and dimensional parameters of the first compensation plate in the compensation capacitor.

In an exemplary embodiment, ends of the first compensation capacitor 21, the second compensation capacitor 22, and the third compensation capacitor 23 close to the reference line O may be substantially flush in the first direction X, and ends of the first compensation capacitor 21, the second compensation capacitor 22, and the third compensation capacitor 23 away from the reference line O form a second step-shaped capacitance area boundary.

In an exemplary embodiment, a first length L1 of the first compensation capacitor 21 may be less than a second length L2 of the second compensation capacitor 22, and the second length L2 of the second compensation capacitor 22 may be less than a third length L3 of the third compensation capacitor 23. The first length L1, the second length L2, and the third length L3 are the maximum dimensions of the first compensation capacitor 21, the second compensation capacitor 22 and the third compensation capacitor 23 in the second direction Y, respectively.

In an exemplary embodiment, a first width M1 of the first compensation capacitor 21 may be greater than a second width M2 of the second compensation capacitor 22, and the second width M2 of the second compensation capacitor 22 may be greater than a third width M3 of the third compensation capacitor 23. The first width M1, the second width M2, and the third width M3 are the maximum dimensions of the first compensation capacitor 21, the second compensation capacitor 22 and the third compensation capacitor 23 in the first direction X, respectively.

Figure 10:
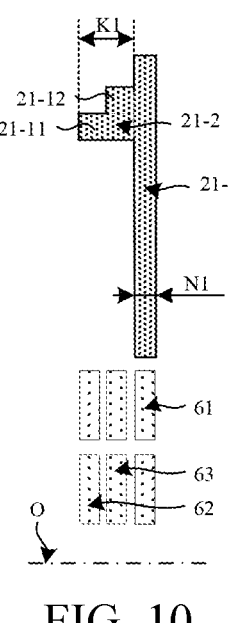
FIG. 10 is a schematic diagram of a structure of a first compensation capacitor according to an exemplary embodiment of the present disclosure.

In an exemplary embodiment, by gradually increasing the lengths and gradually decreasing the widths of the three compensation capacitors in the first direction X, ends of the three compensation capacitors in the first capacitor group away from the reference line O form a step shape from low to high, FIG. 10 is a schematic diagram of a structure of a first compensation capacitor according to an exemplary embodiment of the present disclosure. As shown in FIGS. 9 and 10, in an exemplary embodiment, the first compensation capacitor 21 may at least include a first main body portion 21-1 and a first expansion portion 21-2. The first main body portion 21-1 may have a bar shape extending in the second direction Y, a first end of the first main body portion 21-1 may be provided on a side of the first pixel column 61 away from the reference line O, and a second end of the first main body portion 21-1 extends in a direction away from the reference line O in the second direction Y. The first expansion portion 21-2 may have a block shape or a bar shape extending in the first direction X. A first end of the first expansion portion 21-2 is connected with a side of the first main body portion 21-1 away from the display area, and a second end of the first expansion portion 21-2 extends in a direction away from the display area in the first direction X, so that the end of the first compensation capacitor 21 away from the display area forms a step shape.

In an exemplary embodiment, the first expansion portion 21-2 may at least include a first sub-portion 21-11 and a second sub-portion 21-12, and the first sub-portion 21-11 may be provided on a side of the second sub-portion 21-12 close to the reference line O. Both the first end of the first sub-portion 21-11 and the first end of the second sub-portion 21-12 are connected with a side of the first main body portion 21-1 away from the display area, and both the second end of the first sub-portion 21-11 and the second end of the second sub-portion 21-12 extend in a direction away from the display area in a first direction X. In an exemplary embodiment, in the first direction X, an extension length of the first sub-portion 21-11 may be greater than an extension length of the second sub-portion 21-12, so that the end of the first compensation capacitor 21 away from the reference line O (away from the display area) forms a step shape.

In an exemplary embodiment, the first sub-portion 21-11 may be located at an end of at least two compensation capacitors in the second capacitor group away from the reference line O, and the second sub-portion 21-12 may be located at an end of at least one compensation capacitor of the at least two compensation capacitors away from the reference line O.

In an exemplary embodiment, an orthographic projection of the first main body portion 21-1 on the reference line O is at least partially overlapped with an orthographic projection of the first pixel column 61 on the reference line O, and an orthographic projection of the first expansion portion 21-1 on the reference line O is at least partially overlapped with an orthographic projection of the second pixel column 62 and the third pixel column 63 on the reference line O. The third pixel column 63 is an adjacent pixel column located on a side of the first pixel column 61 away from the display area, and the second pixel column 62 is an adjacent pixel column located on a side of the third pixel column 63 away from the display area.

In an exemplary embodiment, since the extension length of the first sub-portion 21-11 is larger than that of the second sub-portion 21-12, an orthographic projection of the first sub-portion 21-11 on the reference line O is at least partially overlapped with an orthographic projection of the second pixel column 62 and the third pixel column 63 on the reference line O, while an orthographic projection of the second sub-portion 21-12 on the reference line O is at least partially overlapped only with an orthographic projection of the third pixel column 63 on the reference line O.

In an exemplary embodiment, the first main body portion 21-1 has a first main body width N1 in the first direction X and a first length L1 in the second direction Y. The first expansion portion 21-2 has a first expansion width K1 in the first direction X. A sum of the first main body width N1 of the first main body portion 21-1 and the first expansion width K1 of the first expansion portion 21-2 is the first width M1 of the first compensation capacitor 21.

In an exemplary embodiment, the first main body portion 21-1, the first sub-portion 21-11 and the second sub-portion 21-12 may be an integral structure in which they are connected with each other.

Figures 11, 12:
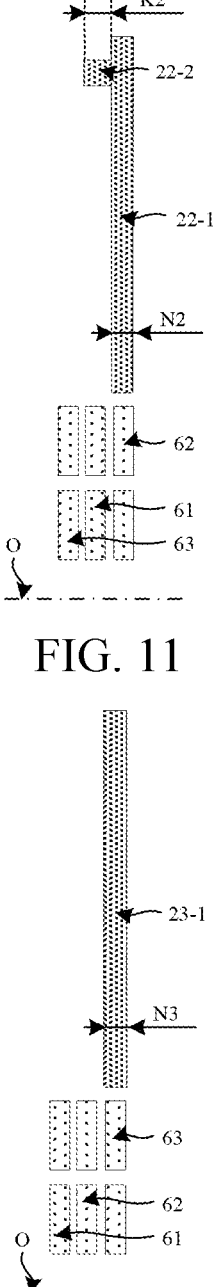
FIG. 11 is a schematic diagram of a structure of a second compensation capacitor according to an exemplary embodiment of the present disclosure.
FIG. 12 is a schematic diagram of a structure of a third compensation capacitor according to an exemplary embodiment of the present disclosure.

FIG. 11 is a schematic diagram of a structure of a second compensation capacitor according to an exemplary embodiment of the present disclosure. As shown in FIGS. 9 and 11, in an exemplary embodiment, the second compensation capacitor 22 may at least include a second main body portion 22-1 and a second expansion portion 22-2. The second main body portion 22-1 may have a bar shape extending in the second direction Y, a first end of the second main body portion 22-1 may be provided on a side of the second pixel column 62 away from the reference line O, and a second end of the second main body portion 22-1 extends in a direction away from the reference line O in the second direction Y. The second expansion portion 22-2 may have a block shape or a bar shape extending in the first direction X. A first end of the second expansion portion 22-2 is connected with a side of the second main body portion 22-1 away from the display area, and a second end of the second expansion portion 22-2 extends in a direction away from the display area in the first direction X, so that the end of the second compensation capacitor 22 away from the display area forms a step shape.

In an exemplary embodiment, an orthographic projection of the second main body portion 22-1 on the reference line O is at least partially overlapped with an orthographic projection of the second pixel column 62 on the reference line O, and an orthographic projection of the second expansion portion 22-2 on the reference line O is at least partially overlapped with an orthographic projection of the first pixel column 61 on the reference line O. The first pixel column 61 is an adjacent pixel column located on a side of the second pixel column 62 away from the display area.

In an exemplary embodiment, the first compensation capacitor 21 is located on a side of the second main body portion 22-1 away from the display area, the second expansion portion 22-2 of the second compensation capacitor 22 may be located on a side of first main body portion 21-1 in the first compensation capacitor 21 away from the reference line O, an orthographic projection of the second expansion portion 22-2 on the reference line O is at least partially overlapped with an orthographic projection of the first main body portion 21-1 on the reference line O.

In an exemplary embodiment, an edge of the second expansion portion 22-2 on a side away from the display area and an edge of the first main body portion 21-1 on the side away from the display area may be substantially flush.

In an exemplary embodiment, the second main body portion 22-1 has a second main body width N2 in the first direction X and a second length L2 in the second direction Y. The second expansion portion 22-2 has a second expansion width K2 in the first direction X. A sum of the second main body width N2 of the second main body portion 22-1 and the second expansion width K2 of the second expansion portion 22-2 is the second width M2 of the second compensation capacitor 22.

In an exemplary embodiment, the second length L2 of the second main body portion 22-1 may be greater than the first length L1 of the first main body portion 21-1, the second main body width N2 of the second main body portion 22-1 may be substantially equal to the first main body width N1 of the first main body portion 21-1, and the second expansion width K2 of the second expansion portion 22-2 may be less than the first expansion width K1 of the first expansion portion 21-2.

In an exemplary embodiment, the second expansion width K2 may be approximately 0.5*the first expansion width K1.

In an exemplary embodiment, the second expansion portion 22-2 in the second compensation capacitor 22 and the second sub-portion 21-12 in the first compensation capacitor 21 may have substantially the same shape and area.

In an exemplary embodiment, the second main body portion 22-1 and the second expansion portion 22-2 may be an integral structure in which they are connected with each other.

FIG. 12 is a schematic diagram of a structure of a third compensation capacitor according to an exemplary embodiment of the present disclosure. As shown in FIGS. 9 and 12, in an exemplary embodiment, the third compensation capacitor 23 may at least include a third main body portion 23-1, which may have a bar shape extending in the second direction Y. A first end of the third main body portion 23-1 may be provided on a side of the third pixel column 63 away from the reference line O, and a second end of the third main body portion 23-1 extends in a direction away from the reference line O in the second direction Y. In an exemplary embodiment, the third compensation capacitor 23 is not provided with an expansion portion, or the expansion width of the expansion portion of the third compensation capacitor 23 is 0.

In an exemplary embodiment, an orthographic projection of the third main body portion 23-1 on the reference line O is at least partially overlapped with an orthographic projection of the third pixel column 63 on the reference line O.

In an exemplary embodiment, the third main body portion 23-1 has a third main body width N3 in the first direction X and a third length L3 in the second direction Y. The third main body width N3 is the third width M3 of the third compensation capacitor 23.

In an exemplary embodiment, the third length L3 of the third main body portion 23-1 may be greater than the second length L2 of the second main body portion 22-1, and the third main body width N2 of the third main body portion 23-1 may be substantially equal to the second main body width N2 of the second main body portion 22-1.

Figure 13:
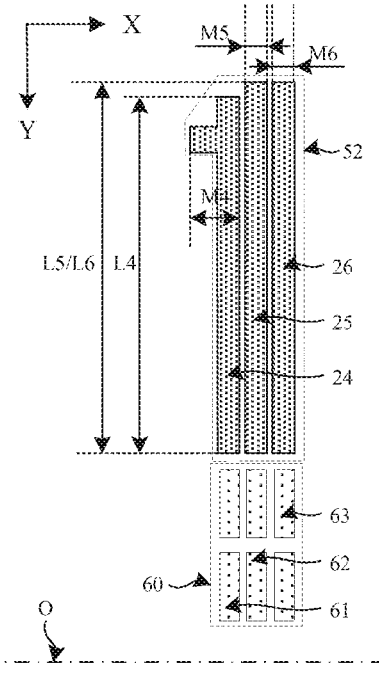
FIG. 13 is a schematic diagram of a structure of a second capacitor group according to an exemplary embodiment of the present disclosure.

FIG. 13 is a schematic diagram of a structure of a second capacitor group according to an exemplary embodiment of the present disclosure. As shown in FIG. 13, a pixel column group 60 may include a first pixel column 61, a second pixel column 62, and a third pixel column 63 provided in sequence in the first direction X, and a second capacitor group 52 may include a fourth compensation capacitor 24, a fifth compensation capacitor 25, and a sixth compensation capacitor 26 provided in sequence in the first direction X. The second capacitor group 52 may be provided on a side of the pixel column group 60 away from the reference line O.

In an exemplary embodiment, an orthographic projection of the fourth compensation capacitor 24 on the reference line O may be at least partially overlapped with an orthographic projection of the first pixel column 61 on the reference line O, an orthographic projection of the fifth compensation capacitor 25 on the reference line O may be at least partially overlapped with an orthographic projection of the second pixel column 62 on the reference line O, and an orthographic projection of the sixth compensation capacitor 26 on the reference line O may be at least partially overlapped with an orthographic projection of the third pixel column 63 on the reference line O.

In an exemplary embodiment, ends of the fourth compensation capacitor 24, the fifth compensation capacitor 25, and the sixth compensation capacitor 26 close to the reference line O may be substantially flush in the first direction X, and ends of the fourth compensation capacitor 24, the fifth compensation capacitor 25, and the sixth compensation capacitor 26 away from the reference line O form a second step-shaped capacitance area boundary.

In an exemplary embodiment, a fourth length L4 of the fourth compensation capacitor 24 may be less than a fifth length L5 of the fifth compensation capacitor 25, and the fifth length L5 of the fifth compensation capacitor 25 may be equal to a sixth length L6 of the sixth compensation capacitor 26. The fourth length L4, the fifth length L5, and the sixth length L6 are the maximum dimensions of the fourth compensation capacitor 24, the fifth compensation capacitor 25 and the sixth compensation capacitor 26 in the second direction Y, respectively.

In an exemplary embodiment, a fourth width M4 of the fourth compensation capacitor 24 may be greater than a fifth width M5 of the fifth compensation capacitor 25, and the fifth width M5 of the fifth compensation capacitor 25 may be equal to a sixth width M6 of the sixth compensation capacitor 26. The fourth width M4, the fifth width M5, and the sixth width M6 are the maximum dimensions of the fourth compensation capacitor 24, the fifth compensation capacitor 25 and the sixth compensation capacitor 26 in the first direction X, respectively.

Figure 14:
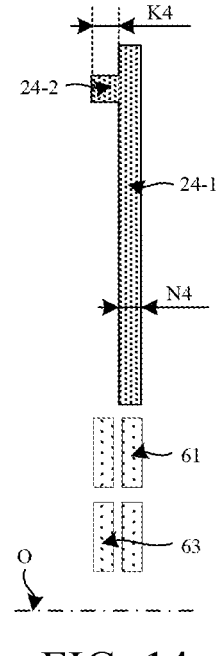
FIG. 14 is a schematic diagram of a structure of a fourth compensation capacitor according to an exemplary embodiment of the present disclosure.

In an exemplary embodiment, by gradually increasing the lengths and gradually decreasing the widths of the three compensation capacitors in the first direction X, ends of the three compensation capacitors in the second capacitor group away from the reference line O form a step shape from low to high, FIG. 14 is a schematic diagram of a structure of a fourth compensation capacitor according to an exemplary embodiment of the present disclosure. As shown in FIGS. 13 and 14, in an exemplary embodiment, the fourth compensation capacitor 24 may at least include a fourth main body portion 24-1 and a fourth expansion portion 24-2. The fourth main body portion 24-1 may have a bar shape extending in the second direction Y, a first end of the fourth main body portion 24-1 may be provided on a side of the first pixel column 61 away from the reference line O, and a second end of the fourth main body portion 24-1 extends in a direction away from the reference line O in the second direction Y. The fourth expansion portion 24-2 may have a block shape or a bar shape extending in the first direction X. A first end of the fourth expansion portion 24-2 is connected with a side of the fourth main body portion 24-1 away from the display area, and a second end of the fourth expansion portion 24-2 extends in a direction away from the display area in the first direction X, so that the end of the fourth compensation capacitor 24 away from the display area forms a step shape.

In an exemplary embodiment, an orthographic projection of the fourth main body portion 24-1 on the reference line O is at least partially overlapped with an orthographic projection of the first pixel column 61 on the reference line O, and an orthographic projection of the fourth expansion portion 24-2 on the reference line O is at least partially overlapped with an orthographic projection of the third pixel column 63 on the reference line O. The third pixel column 63 is an adjacent pixel column located on a side of the first pixel column 61 away from the display area.

In an exemplary embodiment, the first capacitor group may be located on a side of the fourth main body portion 24-1 away from the display area, and the fourth expansion portion 24-2 may be located on a side of at least one compensation capacitor in the first capacitor group away from the reference line O.

In an exemplary embodiment, the fourth expansion portion 24-2 of the fourth compensation capacitor 24 may be located on a side of the third main body portion 23-1 in the third compensation capacitor 23 of the first capacitor group away from the reference line O, and an orthographic projection of the fourth expansion portion 24-2 on the reference line O is at least partially overlapped with an orthographic projection of the third main body portion 23-1 on the reference line O.

In an exemplary embodiment, an edge of the fourth expansion portion 24-2 on a side away from the display area and an edge of the third main body portion 23-1 on the side away from the display area may be substantially flush.

In an exemplary embodiment, the fourth main body portion 24-1 has a fourth main body width N4 in the first direction X and a fourth length L4 in the second direction Y. The fourth expansion portion 24-2 has a fourth expansion width K4 in the first direction X. A sum of the fourth main body width N4 of the fourth main body portion 24-1 and the fourth expansion width K4 of the fourth expansion portion 24-2 is the fourth width M4 of the fourth compensation capacitor 24.

In an exemplary embodiment, the fourth main body portion 24-1 and the fourth expansion portion 24-2 may be an integral structure in which they are connected with each other.

Figures 15, 16:
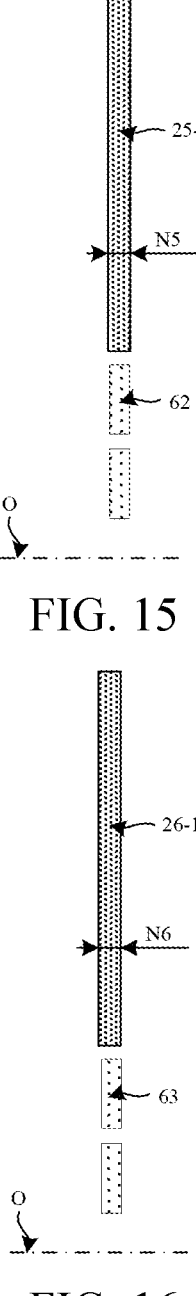
FIG. 15 is a schematic diagram of a structure of a fifth compensation capacitor according to an exemplary embodiment of the present disclosure.
FIG. 16 is a schematic diagram of a structure of a sixth compensation capacitor according to an exemplary embodiment of the present disclosure.

FIG. 15 is a schematic diagram of a structure of a fifth compensation capacitor according to an exemplary embodiment of the present disclosure. As shown in FIGS. 13 and 15, in an exemplary embodiment, the fifth compensation capacitor 25 may at least include a fifth main body portion 25-1, which may have a bar shape extending in the second direction Y. A first end of the fifth main body portion 25-1 may be provided on a side of the second pixel column 62 away from the reference line O, and a second end of the fifth main body portion 25-1 extends in a direction away from the reference line O in the second direction Y. In an exemplary embodiment, the fifth compensation capacitor 25 is not provided with an expansion portion, or the expansion width of the expansion portion of the fifth compensation capacitor 25 is 0.

In an exemplary embodiment, an orthographic projection of the fifth main body portion 25-1 on the reference line O is at least partially overlapped with an orthographic projection of the second pixel column 62 on the reference line O.

In an exemplary embodiment, the fifth main body portion 25-1 has a fifth main body width N5 in the first direction X and a fifth length L5 in the second direction Y. The fifth main body width N5 is the fifth width M5 of the fifth compensation capacitor 25.

In an exemplary embodiment, the fifth length L5 of the fifth main body portion 25-1 may be greater than the fourth length L4 of the fourth main body portion 24-1, and the fifth main body width N5 of the fifth main body portion 25-1 may be substantially equal to the fourth main body width N4 of the fourth main body portion 24-1.

FIG. 16 is a schematic diagram of a structure of a sixth compensation capacitor according to an exemplary embodiment of the present disclosure. As shown in FIGS. 13 and 16, in an exemplary embodiment, the sixth compensation capacitor 26 may at least include a sixth main body portion 26-1, which may have a bar shape extending in the second direction Y. A first end of the sixth main body portion 26-1 may be provided on a side of the third pixel column 63 away from the reference line O, and a second end of the sixth main body portion 26-1 extends in a direction away from the reference line O in the second direction Y. In an exemplary embodiment, the sixth compensation capacitor 26 is not provided with an expansion portion, or the expansion width of the expansion portion of the sixth compensation capacitor 26 is 0.

In an exemplary embodiment, an orthographic projection of the sixth main body portion 26-1 on the reference line O is at least partially overlapped with an orthographic projection of the third pixel column 63 on the reference line O.

In an exemplary embodiment, the sixth main body portion 26-1 has a sixth main body width N6 in the first direction X and a sixth length L6 in the second direction Y. The third main body width N3 is the sixth width M6 of the sixth compensation capacitor 26.

In an exemplary embodiment, the sixth length L6 of the sixth main body portion 26-1 may be equal to the fifth length L5 of the fifth main body portion 25-1, and the third main body width N2 of the sixth main body portion 26-1 may be equal to the fifth main body width N5 of the fifth main body portion 25-1.

Figures 17, 18, 19:
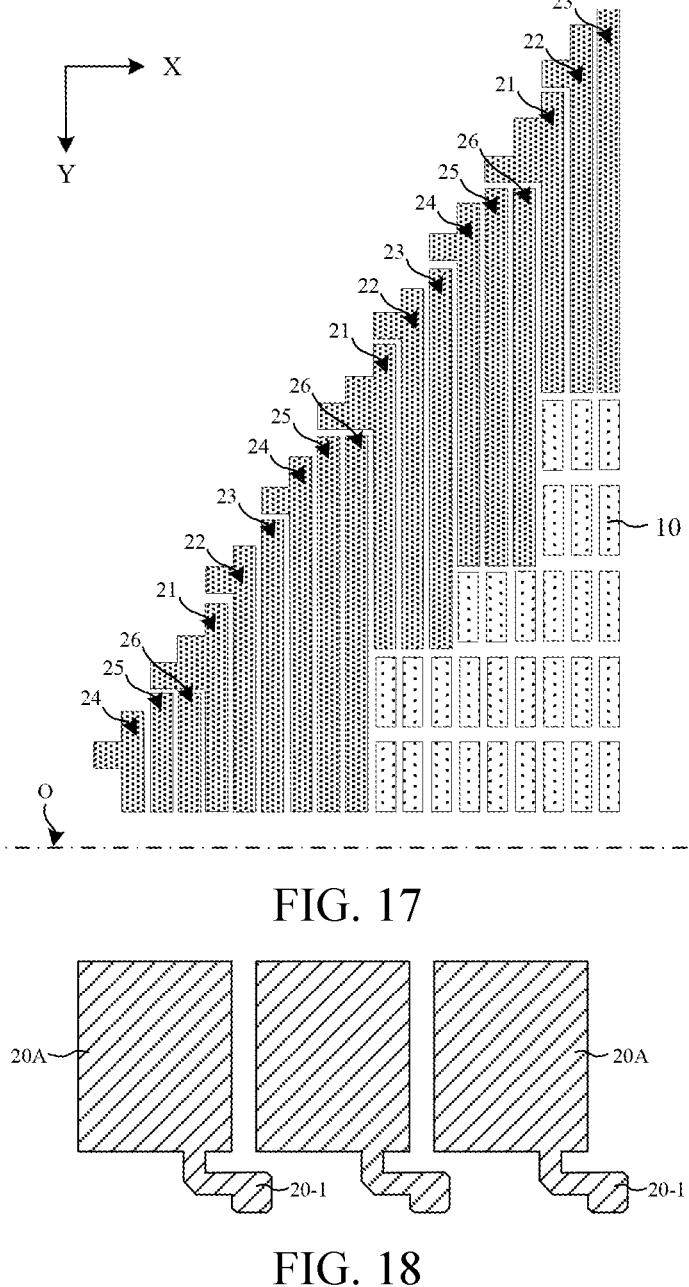
FIG. 17 is a schematic diagram of an arrangement of a compensation capacitor according to an exemplary embodiment of the present disclosure.
FIG. 18 is a schematic diagram of a display substrate after formation of a pattern of a first conductive layer according to an embodiment of the present disclosure.
FIG. 19 is a schematic diagram of a display substrate after formation of a pattern of a second conductive layer according to an embodiment of the present disclosure.

FIG. 17 is a schematic diagram of an arrangement of a compensation capacitor according to an exemplary embodiment of the present disclosure. In an exemplary embodiment, the first capacitor group may include a first compensation capacitor 21, a second compensation capacitor 22, and a third compensation capacitor 23. The second capacitor group may include a fourth compensation capacitor 24, a fifth compensation capacitor 25, and a sixth compensation capacitor 26. A plurality of first capacitor groups and a plurality of second capacitor groups may be alternately provided in an extending direction of the display area boundary, i.e., the first compensation capacitor 21, the second compensation capacitor 22, the third compensation capacitor 23, the fourth compensation capacitor 24, the fifth compensation capacitor 25, and the sixth compensation capacitor 26 may be periodically arranged in the extending direction of the display area boundary.

In an exemplary embodiment, ends of the plurality of compensation capacitors in each capacitor group close to the reference line O may be substantially flush in the first direction X, and ends of the plurality of compensation capacitors in each capacitor group away from the reference line O form a second step-shaped capacitance area boundary.

In an exemplary embodiment, an orthographic projection of at least one first compensation capacitor 21 on the reference line O is at least partially overlapped with an orthographic projection of the adjacent second compensation capacitor 22 in the first direction X on the reference line O, and a second expansion portion of the second compensation capacitor 22 is provided on a side of the first main body portion of the first compensation capacitor 21 away from the reference line O. The orthographic projection of the second main body portion of the second compensation capacitor 22 on the reference line O is not overlapped with the orthographic projection of the first main body portion of the first compensation capacitor 21 on the reference line O, and the orthographic projection of the second expansion portion of the second compensation capacitor 22 on the reference line O is at least partially overlapped with the orthographic projection of the first main body portion of the first compensation capacitor 21 on the reference line O.

In an exemplary embodiment, the orthographic projection of at least one second compensation capacitor 22 on the reference line O is not overlapped with the orthographic projection of the adjacent third compensation capacitor 23 in the first direction X on the reference line O.

In an exemplary embodiment, an orthographic projection of at least one third compensation capacitor 23 on the reference line O is at least partially overlapped with an orthographic projection of the adjacent fourth compensation capacitor 24 in the first direction X on the reference line O, and a fourth expansion portion of the fourth compensation capacitor 24 is provided on a side of the third main body portion of the third compensation capacitor 23 away from the reference line O. In an exemplary embodiment, the orthographic projection of the fourth main body portion of the fourth compensation capacitor 24 on the reference line O is not overlapped with the orthographic projection of the third main body portion of the third compensation capacitor 23 on the reference line O, and the orthographic projection of the fourth expansion portion of the fourth compensation capacitor 24 on the reference line O is at least partially overlapped with the orthographic projection of the third main body portion of the third compensation capacitor 23 on the reference line O.

In an exemplary embodiment, the orthographic projection of at least one fourth compensation capacitor 24 on the reference line O is not overlapped with the orthographic projection of the adjacent fifth compensation capacitor 25 in the first direction X on the reference line O.

In an exemplary embodiment, the orthographic projection of at least one fifth compensation capacitor 25 on the reference line O is not overlapped with the orthographic projection of the adjacent sixth compensation capacitor 26 in the first direction X on the reference line O.

In an exemplary embodiment, an orthographic projection of at least one of the fifth compensation capacitor 25 and the sixth compensation capacitor 26 on the reference line O is at least partially overlapped with the orthographic projection of the adjacent first compensation capacitor 21 in the first direction X on the reference line O, and the first extension portion of the first compensation capacitor 21 is provided on a side of the fifth compensation capacitor 25 and sixth compensation capacitor 26 away from the reference line O. In an exemplary embodiment, the orthographic projection of the first main body portion of the first compensation capacitor 21 on the reference line O is not overlapped with the orthographic projection of the fifth compensation capacitor 25 and the sixth compensation capacitor 26 on the reference line O, and the orthographic projection of the first expansion portion of the first compensation capacitor 21 on the reference line O is at least partially overlapped with the orthographic projection of the fifth compensation capacitor 25 and the sixth compensation capacitor 26 on the reference line O.

In an exemplary embodiment, the orthographic projection of the first sub-portion of the first compensation capacitor 21 on the reference line O is at least partially overlapped with the orthographic projection of the fifth compensation capacitor 25 and the sixth compensation capacitor 26 on the reference line O. The orthographic projection of the second sub-portion of the first compensation capacitor 21 on the reference line O is not overlapped with the orthographic projection of the fifth compensation capacitor 25 on the reference line O, and the orthographic projection of the second sub-portion of the first compensation capacitor 21 on the reference line O is at least partially overlapped with the orthographic projection of the sixth compensation capacitor 26 on the reference line O.

Exemplary description is made below through a manufacturing process for a display substrate. "Patterning processes" mentioned in the present disclosure include photoresist coating, mask exposure, development, etching, photoresist stripping, etc., for metal materials, inorganic materials or transparent conductive materials, and include organic material coating, mask exposure, development, etc., for organic materials. Deposition may be any one or more of sputtering, evaporation and chemical vapor deposition, coating may be any one or more of spray coating, spin coating and inkjet printing, and etching may be any one or more of dry etching and wet etching, the present disclosure is not limited thereto. "Film" refers to a layer of film formed from a certain material on a base substrate using deposition, coating or other processes. If the "film" does not need to be processed through a patterning process in the entire manufacturing process, the "film" may also be called a "layer". If the "film" needs to be processed through the patterning process in the entire manufacturing process, the "film" is called a "film" before the patterning process is performed and is called a "layer" after the patterning process is performed. At least one "pattern" is contained in the "layer" which has been processed through the patterning process. "A and B are disposed on the same layer" in the present disclosure means that A and B are formed simultaneously through the same running of the patterning processes, and the "thickness" of the film layer is the size of the film layer in a direction perpendicular to the display substrate. In an exemplary embodiment of the present disclosure, "an orthographic projection of A includes an orthographic projection of B" refers to that a boundary of the orthographic projection of B falls within a range of a boundary of the orthographic projection of A, or the boundary of the orthographic projection of A is overlapped with the boundary of the orthographic projection of B.

In an exemplary embodiment, a process for preparing the display substrate may include the following operations.

(1) A pattern of a semiconductor layer is formed. In an exemplary embodiment, the operation of forming a pattern of a semiconductor layer may include: sequentially depositing a first insulating film and a semiconductor film on a base substrate, and patterning the semiconductor film by a patterning process, to form a first insulating layer covering the base substrate and a pattern of a semiconductor layer provided on the first insulating layer, wherein the pattern of the semiconductor layer may be provided in the display area, and may at least include active layers of a plurality of transistors in a pixel driving circuit.

(2) A pattern of a first conductive layer is formed. In an exemplary embodiment, the operation of forming a pattern of a first conductive layer may include: sequentially depositing a second insulation film and a first conductive film on the base substrate on which the aforementioned pattern is formed, and patterning the first conductive film by a patterning process, to form a second insulation layer covering the pattern of the semiconductor layer and a pattern of a first conductive layer provided on the second insulation layer, wherein the first conductive layer may be referred to as a first gate metal (GATE1) layer.

In an exemplary embodiment, the pattern of the first conductive layer may be provided in the display area and the bezel area, the first conductive layer of the display area may at least include gate electrodes of the plurality of transistors in the pixel driving circuit and a first plate of a storage capacitor, and the first conductive layer of the bezel area may at least include a first compensation plate 20A of the compensation capacitor, as shown in FIG. 18.

In an exemplary embodiment, a plurality of first compensation plates 20A may be provided at intervals and each may have a rectangular shape, and a side of the first compensation plate 20A close to the display area is provided with a first connection block 20-1. The first connection block 20-1 may have a polyline shape, a first end of the first connection block 20-1 is connected with the first compensation plate 20A, a second end of the first connection block 20-1 extends in the direction of the display area, and the first connection block 20-1 is configured to be connected with a data signal line formed subsequently.

(3) A pattern of a second conductive layer is formed. In an exemplary embodiment, the operation of forming a pattern of a second conductive layer may include: sequentially depositing a third insulating film and a second conductive film on a base substrate on which the aforementioned pattern is formed, and patterning the second conductive film by a patterning process, to form a third insulating layer covering the pattern of the first conductive layer and a pattern of a second conductive layer provided on the third insulating layer, wherein the second conductive layer may be referred to as a second gate metal (GATE2) layer.

In an exemplary embodiment, the pattern of the second conductive layer may be provided in the display area and the bezel area, the second conductive layer of the display area may at least include a second plate of the storage capacitor, the first plate and the second plate constitute a storage capacitor of the pixel driving circuit, and the second conductive layer of the bezel area may at least include a second compensation plate 20B of the compensation capacitor, as shown in FIG. 19.

In an exemplary embodiment, an orthographic projection of the second compensation plate 20B on the base substrate is at least partially overlapped with an orthographic projection of the first compensation plate 20A on the base substrate, and the first compensation plate 20A and the second compensation plate 20B constitute a compensation capacitor.

In an exemplary embodiment, a shape of the second compensation plate 20B may be rectangular and a side of the second compensation plate 20B close to the display area is provided with a second connection block 20-2. The second connection block 20-2 may have a polyline shape, a first end of the second connection block 20-2 is connected with the second compensation plate 20B, a second end of the second connection block 20-2 extends in the direction of the display area, and the second connection block 20-2 is configured to be connected with a first power supply line formed subsequently.

In an exemplary embodiment, the plurality of second compensation plates 20B may be an integral structure in which they are connected with each other.

(4) Patterns of a fourth insulating layer and a third conductive layer are formed. In an exemplary embodiment, the operation of forming patterns of a fourth insulating layer and a third conductive layer may include: first depositing a fourth insulating film on a base substrate on which the aforementioned pattern is formed, patterning the fourth insulating film by a patterning process, to form a fourth insulating layer covering the pattern of the third conductive layer, wherein a plurality of via holes are provided on the fourth insulating layer, and the plurality of via holes in the bezel area include at least a first via hole exposing the first connection block 20-1 and a second via hole exposing the second connection block 20-2; Subsequently depositing a third conductive film, and patterning the third conductive film by a patterning process, to form a pattern of a third conductive layer provided on the fourth insulating layer, wherein the third conductive layer may be referred to as a first source-drain metal (SD1) layer.

Figure 20:
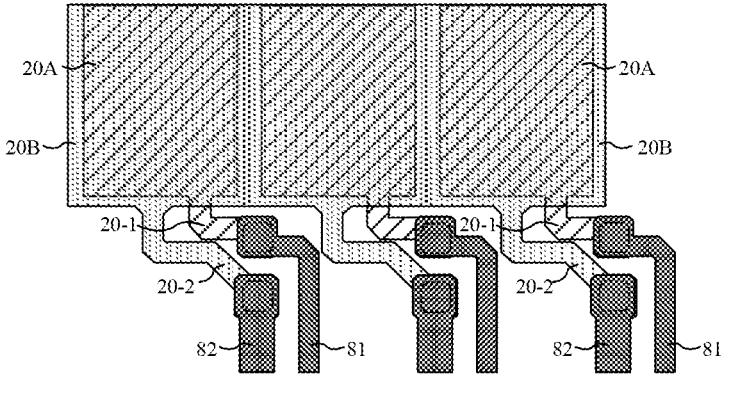
FIG. 20 is a schematic diagram of a display substrate after formation of a pattern of a third conductive layer according to an embodiment of the present disclosure.

In an exemplary embodiment, the third conductive layer may be provided in the display area and the bezel area, and may at least include a data signal line 81 connected with the first connection block 20-1 through the first via hole and a first power supply line 82 connected with the second connection block 20-2 through the second via hole, enabling one compensation plate of the compensation capacitor to be connected with the data signal line 81 and the other compensation plate of the compensation capacitor to be connected with the first power supply line 82, as shown in FIG. 20.

Figure 21:
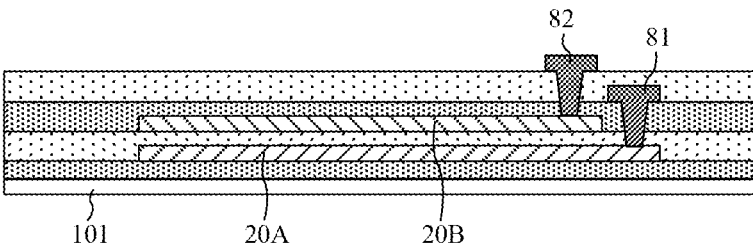
FIG. 21 is a schematic diagram of a sectional structure of a compensation capacitor according to an embodiment of the present disclosure.

FIG. 21 is a schematic diagram of a sectional structure of a compensation capacitor according to an embodiment of the present disclosure. As shown in FIG. 21, the display substrate may include a base substrate 101 and a first conductive layer, a second conductive layer, a third conductive layer, and a fourth conductive layer that are provided in sequence on the base substrate 101 in a direction away from the base substrate, wherein an insulating layer may be provided between adjacent conductive layers. In an exemplary embodiment, the first compensation plate 20A may be provided in the first conductive layer, and the second compensation plate 20B may be provided in the second conductive layer. An orthographic projection of the second compensation plate 20B on the base substrate is at least partially overlapped with an orthographic projection of the first compensation plate 20A on the base substrate, and the first compensation plate 20A and the second compensation plate 20B constitute a compensation capacitor. In an exemplary embodiment, the data signal line 81 may be provided in the third conductive layer, the first power supply line 82 may be provided in the fourth conductive layer, the data signal line 81 is connected with the first compensation plate 20A through a via hole, and the first power supply line 82 is connected with the second compensation plate 20B through a via hole.

In an exemplary embodiment, the data signal line 81 may be provided in the fourth conductive layer, the data signal line 81 may be connected with the second compensation plate 20B through a via hole, and the first power supply line 82 may be connected with the first compensation plate 20A through a via hole, which is not limited in the present disclosure.

In another exemplary embodiment, the first compensation plate 20A may be provided in one of the first to fourth conductive layers, the second compensation plate 20B may be provided in another of the first to fourth conductive layers, the first compensation plate 20A and the second compensation plate 20B may be provided in different conductive layers, the first compensation plate 20A may be connected with one of the data signal line 81 and the first power supply line 82, and the second compensation plate 20B may be connected with the other of the data signal line 81 and the first power supply line 82, which is not limited in the present disclosure.

Figure 22:
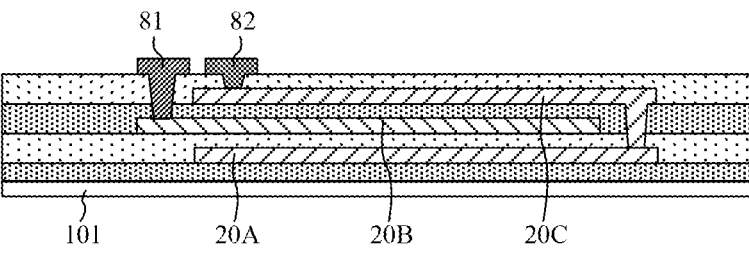
FIG. 22 is a schematic diagram of a sectional structure of another compensation capacitor according to an embodiment of the present disclosure.

FIG. 22 is a schematic diagram of a sectional structure of another compensation capacitor according to an embodiment of the present disclosure. As shown in FIG. 22, the display substrate may include a base substrate 101 and a first conductive layer, a second conductive layer, a third conductive layer, and a fourth conductive layer that are provided in sequence on the base substrate 101 in a direction away from the base substrate, wherein an insulating layer may be provided between adjacent conductive layers. In an exemplary embodiment, a first compensation plate 20A may be provided in the first conductive layer, a second compensation plate 20B may be provided in the second conductive layer, a third compensation plate 20C may be provided in the third conductive layer, a data signal line 81 and a first power supply line 82 may be provided in the fourth conductive layer, the data signal line 81 is connected with the second compensation plate 20B through a via hole, and the first power supply line 82 is connected with the third compensation plate 20C through a via hole connect.

In an exemplary embodiment, the compensation capacitor of the present embodiment includes a first compensation plate 20A, a second compensation plate 20B and a third compensation plate 20C. An orthographic projection of the second compensation plate 20B on the base substrate is at least partially overlapped with an orthographic projection of the first compensation plate 20A on the base substrate, and the first compensation plate 20A and the second compensation plate 20B constitute a first sub-capacitor. An orthographic projection of the third compensation plate 20C on the base substrate is at least partially overlapped with an orthographic projection of the second compensation plate 20B on the base substrate, and the second compensation plate 20B and the third compensation plate 20C constitute a second sub-capacitor. An orthographic projection of the third compensation plate 20C on the base substrate is at least partially overlapped with an orthographic projection of the first compensation plate 20A on the base substrate, and the third compensation plate 20C is connected with the first compensation plate 20A through a via hole, so that the first compensation plate 20A and the third compensation plate 20C have the same potential, and the first sub-capacitor and the second sub-capacitor in a parallel structure constitute a compensation capacitor.

In an exemplary embodiment, the data signal line 81 may be connected with the third compensation plate 20C through a via hole and the first power supply line 82 may be connected with the second compensation plate 20B through a via hole, which is not limited in the present disclosure.

In another exemplary embodiment, the first compensation plate 20A may be provided in the first conductive layer, the second compensation plate 20B may be provided in the second conductive layer, and the third compensation plate 20C may be provided on a side of the second compensation plate 20B away from the first compensation plate 20A. Alternatively, the first compensation plate 20A may be provided in the second conductive layer, the second compensation plate 20B may be provided in the third conductive layer, and the third compensation plate 20C may be provided on a side of the first compensation plate 20A away from the second compensation plate 20B. Alternatively, the first compensation plate 20A may be provided in the first conductive layer, the second compensation plate 20B may be provided in the third conductive layer, and the third compensation plate 20C may be provided between the first compensation plate 20A and the second compensation plate 20B, which is not limited in the present disclosure.

In an exemplary embodiment, the structures of the compensation capacitor shown in FIGS. 18 to 22 are only exemplary structures and may be provided as other structural forms according to actual conditions, which is not limited in the present disclosure.

Figure 23:
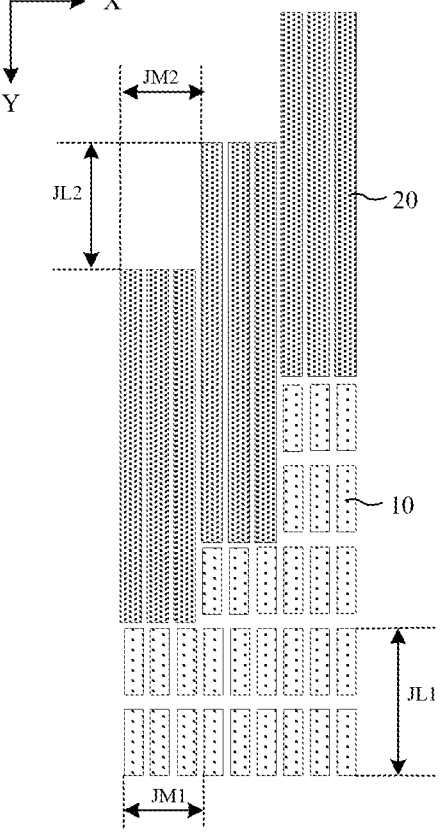
FIG. 23 is a schematic diagram of an arrangement of a compensation capacitor on an existing display substrate.

FIG. 23 is a schematic diagram of an arrangement of a compensation capacitor on an existing display substrate. As shown in FIG. 23, quantities of sub-pixels 10 of the plurality of pixel columns in the display area 100 may be different, and quantities of sub-pixels 10 in the pixel column may be gradually reduced in a direction of the bezel area 200, so that the display area boundary on a side of the display area 100 close to the bezel area 200 includes a plurality of first steps connected in sequence, the first steps having a first step length JL1 and a first step width JM1. The plurality of compensation capacitors 20 in the capacitance area of the bezel area all have a bar shape extending in the second direction Y, so that the capacitance area boundary of the plurality of compensation capacitors 20 on a side away from the display area includes a plurality of second steps connected in sequence, the second steps having a second step length JL2 and a second step width JM2. The first step length JL1 of the display area boundary is substantially equal to the second step length JL2 of the capacitance area boundary, and the first step width JM1 of the display area boundary is substantially equal to the second step width JM2 of the capacitance area boundary. Due to the large size of the second step of the capacitance area boundary, there are many triangular clearance areas in the capacitance area. Limited by the position of the compensation capacitor, the gate driving circuit may only be arranged outside the compensation capacitor and the clearance area, resulting in a waste of layout space and a large width of the capacitance area.

According to the structure and preparation flow of the display substrate described above, the display substrate provided by the exemplary embodiment of the present disclosure may effectively reduce the width of the capacitance area by forming a capacitive area boundary with smaller steps, thereby reducing the width of the bezel area and realizing the narrowing of the bezel. According to the present disclosure, a main body portion and an expansion portion are provided in part of the compensation capacitors, the shape of the main body portion is similar to that of the existing structure, and the expansion portion is provided on a side of the main body portion. That is, part of the compensation capacitors is moved to the clearance area on a side of the main body portion. Therefore, the integral length of the compensation capacitor is effectively reduced without reducing the compensation area of the compensation capacitor, the capacitance area boundary formed with smaller steps effectively reduces the clearance area, the layout space is reduced, the width of the capacitance area is reduced on the premise of ensuring the compensation area of the compensation capacitor, and the integral width of the bezel area may be reduced by about 50 μm to 60 μm. The preparation process of this exemplary embodiment may be implemented by using the existing mature preparation equipment, which has slight improvement on the existing processes, and may be well compatible with the existing preparation processes. The processes are easy to realize and easy to implement, with high production efficiency, low production costs, and high yield.

Figure 24:
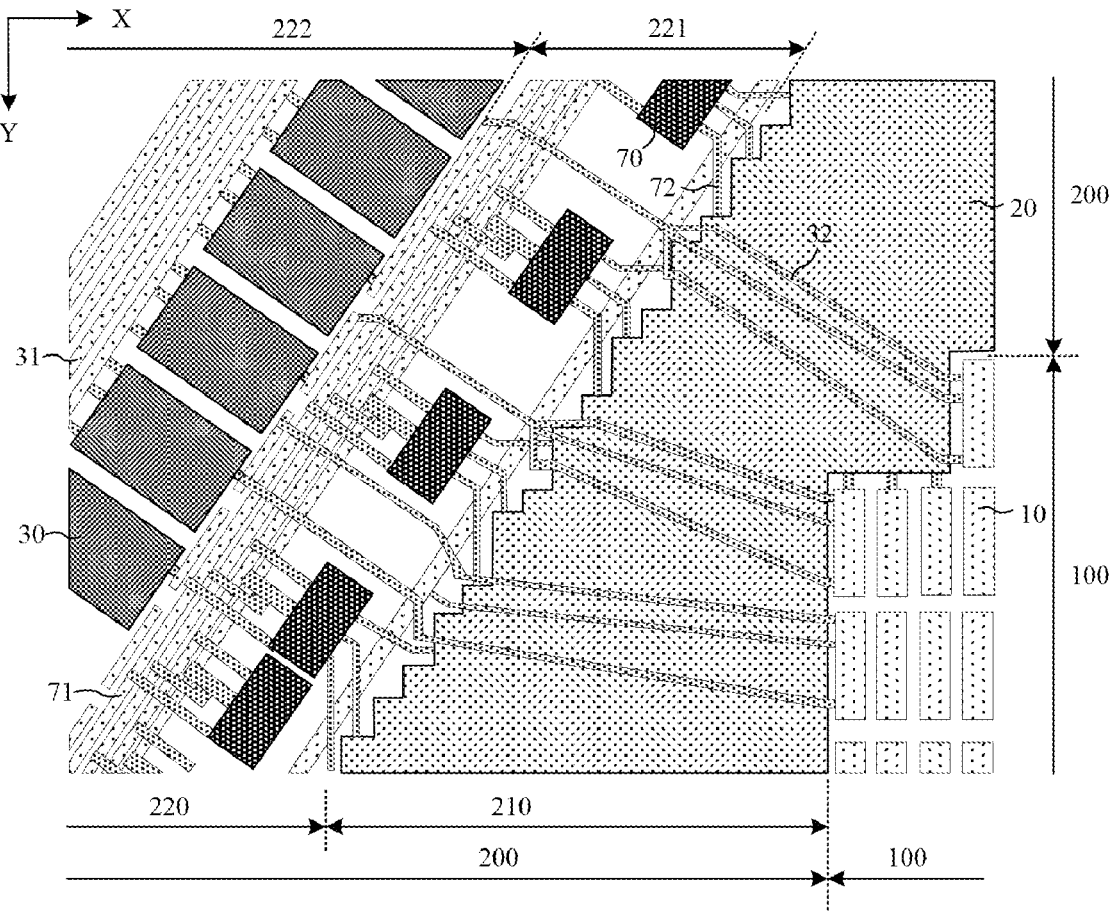
FIG. 24 is a schematic diagram of a planar structure of another display substrate according to an exemplary embodiment of the present disclosure.

FIG. 24 is a schematic diagram of a planar structure of another display substrate according to an exemplary embodiment of the present disclosure, illustrating a structure of a circuit area in a first corner portion. As shown in FIG. 24, in an exemplary embodiment, the circuit area 220 of the first corner portion may include a first circuit area 221 and a second circuit area 222 located on a side of the first circuit area 221 away from the display area 100, that is, the first circuit area 221 and the second circuit area 222 are provided in sequence in a direction away from the display area 100. In an exemplary embodiment, the first circuit area 221 is provided at least with a plurality of test circuits 70 and a plurality of test signal lines 71, the second circuit area 222 is provided at least with a plurality of gate driving circuits 30 and a plurality of gate signal lines 31, and the plurality of test circuits 70 and the plurality of gate driving circuits 30 may be provided in sequence in an extending direction of the display area boundary.

In an exemplary embodiment, the test circuit 70 may have a rectangular shape, input terminals of the plurality of test circuits 70 are respectively connected with the plurality of test signal lines 71 through a connection line, output terminals of the plurality of test circuits 70 are respectively connected with the first compensation plates of the plurality of compensation capacitors 20 through a test output line 72, and the test circuit 70 is configured to provide a test signal to a data signal line of the display area 100.

In an exemplary embodiment, one end of the first compensation plate of the compensation capacitor 20 close to the test circuit 70 is connected with the test output line 72, and the other end close to the display area is connected with the data signal line of the display area, that is, the test output line 72 of the test circuit 70 is connected with the data signal line of the display area through the first compensation plate of the compensation capacitor 20.

In an exemplary embodiment, the plurality of test signal lines 71 may have a bar shape extending in an extending direction of the display area boundary, and the plurality of test signal lines 71 may be provided on a side of the plurality of test circuits 70 away from the display area and between the plurality of test circuits 70 and the plurality of gate driving circuits 30.

In an exemplary embodiment, the gate driving circuit 30 may have a rectangular shape, input ends of the plurality of gate driving circuits 30 are respectively connected with the plurality of gate signal lines 31 through a connection line, output ends of the plurality of gate driving circuits 30 are respectively connected with the scan signal lines and the light-emitting signal lines in the plurality of pixel rows in the display area 100 through a gate output line 32 correspondingly, and the gate driving circuit 30 is configured to supply a scan signal and a light-emitting signal to the scan signal line and the light-emitting signal line of the display area 100. The plurality of gate signal lines 31 may have a bar shape extending in the extending direction of the display area boundary and may be provided on a side of the plurality of gate driving circuits 30 away from the display area.

In an exemplary embodiment, since the corner area in the bezel area have a fan-ring shape, and an edge on a side close to the display area and an edge on a side away from the display area in the corner area have an arc shape, both the first circuit area 221 and the second circuit area 222 in the present disclosure have a fan-ring shape. The plurality of test circuits 70 are provided in the first circuit area 221 in a rotating manner to form an annular arrangement of the plurality of test circuits 70, and the plurality of gate driving circuits 30 are provided in the second circuit area 222 in a rotating manner to form an annular arrangement of the plurality of gate driving circuits 30.

In an exemplary embodiment, a third bezel (upper bezel) in the bezel area 200 may be provided with a plurality of test circuits 70, which may be provided in sequence in the first direction X and have substantially the same shape and providing posture. At least one test circuit 70 may have a first center line which may be a straight line bisecting the test circuit 70 in the first direction X and extending in the second direction Y. The plurality of test circuits 70 have substantially the same providing posture, which means that an included angle between the first center line of the plurality of test circuits 70 and the second direction Y is about 0 degrees.

In an exemplary embodiment, a first bezel (left bezel) in the bezel area 200 may be provided with a plurality of gate driving circuits 30, which may be provided in sequence in the second direction Y and have substantially the same shape and providing posture. At least one gate driving circuit 30 may have a second center line which may be a straight line bisecting the gate driving circuit 30 in the second direction Y and extending in the first direction X. The plurality of gate driving circuits 30 have substantially the same providing posture, which means that an included angle between the second center line of the plurality of gate driving circuits 30 and the first direction X is about 0 degrees.

In an exemplary embodiment, a first corner portion (upper left corner area) of the bezel area 200 located between the first bezel (left bezel) and the third bezel (upper bezel) may be provided with a plurality of test circuits 70 and a plurality of gate driving circuits 30. In an exemplary embodiment, shapes of the plurality of test circuits 70 of the first corner portion may be substantially the same, but the plurality of test circuits 70 are provided in different postures. The included angle between the first center line of the plurality of test circuits 70 and the second direction Y is gradually increased in a direction away from the third bezel (close to the first bezel), that is, the plurality of test circuits 70 gradually increase the rotation angle, so that the plurality of test circuits 70 form an annular arrangement. In an exemplary embodiment, shapes of the plurality of gate driving circuits 30 of the first corner portion may be substantially the same, but the plurality of gate driving circuits 30 are provided in different postures. The included angle between the second center line of the plurality of gate driving circuits 30 and the first direction X is gradually increased in a direction away from the first bezel (close to the third bezel), that is, the plurality of gate driving circuits 30 gradually increase the rotation angle, so that the plurality of gate driving circuits 30 form an annular arrangement.

In an exemplary embodiment, the shape of the test circuit 70 in the first corner portion may be substantially the same as the shape of the test circuit 70 in the third bezel, and the shape of the gate driving circuit 30 in the first corner portion may be substantially the same as the shape of the gate driving circuit 30 in the first bezel.

In an exemplary embodiment, edges of the plurality of annularly arranged test circuits 70 on a side away from the display area may form an arcuate first edge line, edges of the plurality of annularly arranged gate driving circuits 30 on a side close to the display area may form an arcuate second edge line, a first distance between the first edge line and the display area boundary may be less than a second distance between the second edge line and the display area boundary, the first distance may be a minimum distance between the first edge line and the display area boundary, and the second distance may be a minimum distance between the second edge line and the display area boundary.

In an exemplary embodiment, a structure of the second corner portion may be substantially the same as that of the first corner portion, and the structure of the first corner portion and the structure of the second corner portion may be mirror-symmetrical with respect to the display area.

Figure 25:
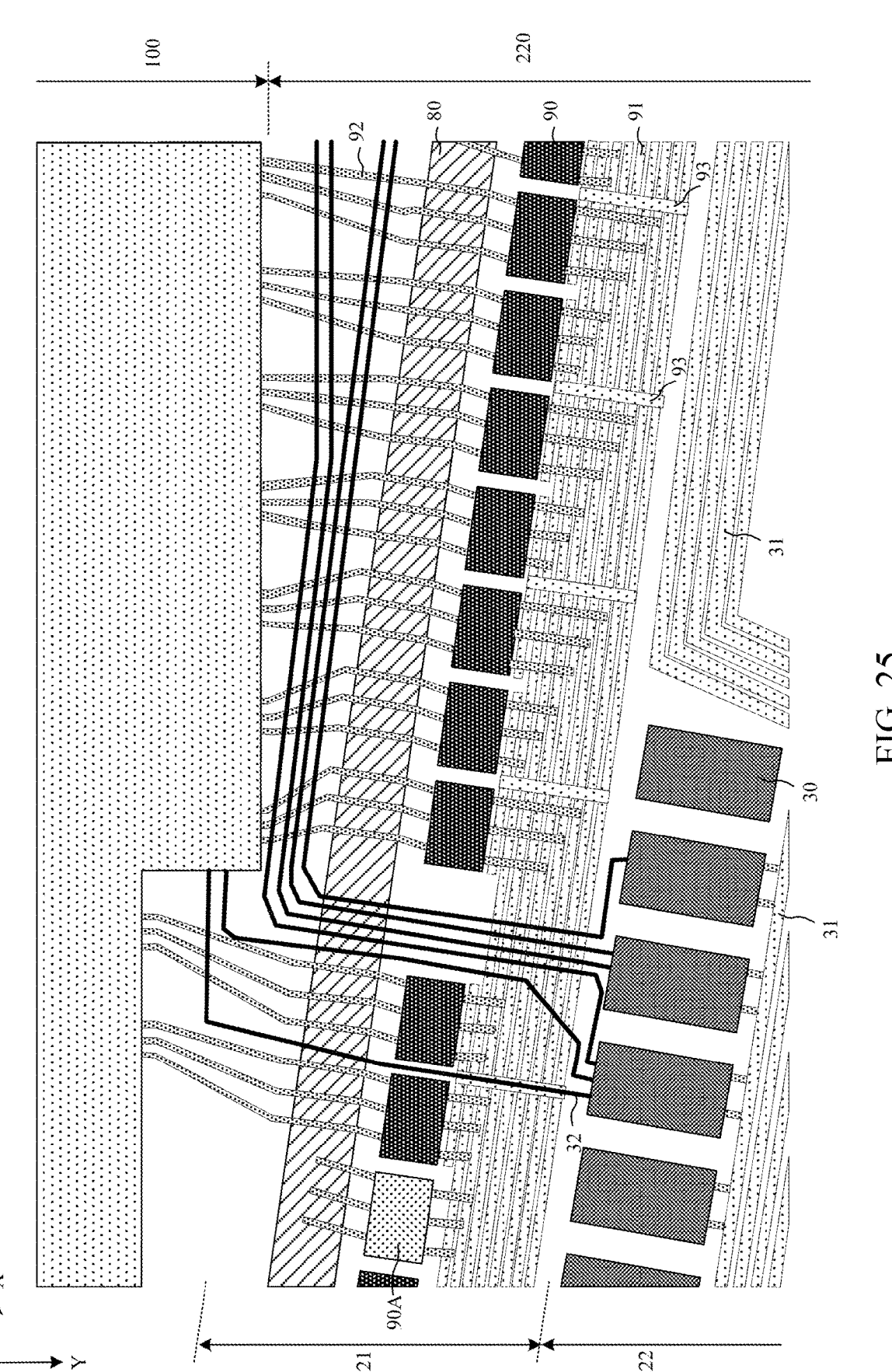
FIGS. 25 and 26 are schematic diagrams of a planar structure of yet another display substrate according to an exemplary embodiment of the present disclosure.
Figure 26:
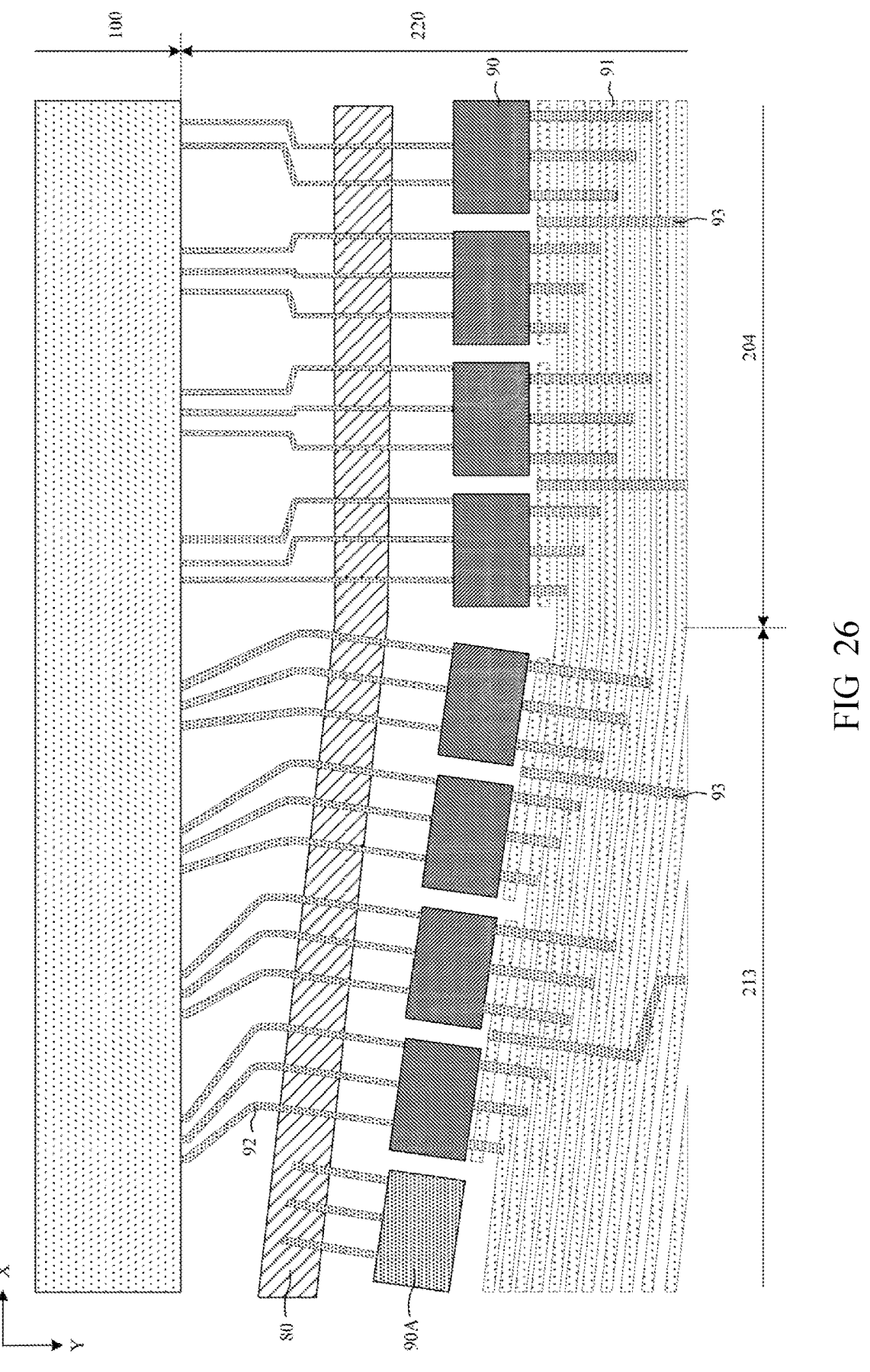

FIGS. 25 and 26 are schematic diagrams of a planar structure of yet another display substrate according to an exemplary embodiment of the present disclosure, illustrating a structure of a circuit area in the fourth bezel 204 and the third corner portion 213. As shown in FIGS. 25 and 26, in an exemplary embodiment, no compensation capacitor is provided in the fourth bezel 204 and the third corner portion 213, so the circuit area 220 may be provided on a side of the display area 100, and the circuit area 220 may at least include a first circuit area 221 and a second circuit area 222 located on a side of the first circuit area 221 away from the display area 100. In an exemplary embodiment, the first circuit area 221 is provided at least with a plurality of multiplexing (MUX) circuits 90, a plurality of selection signal lines 91, and a high voltage power supply trace 80. The second circuit area 222 is provided at least with a plurality of gate driving circuits 30 and a plurality of gate signal lines 31. The plurality of multiplexing circuits 90 and the plurality of gate driving circuits 30 may be provided in sequence in an extending direction of the display area boundary.

In an exemplary embodiment, the multiplexing circuit 90 may have a rectangular shape, input ends of the plurality of multiplexing circuits 90 are respectively connected with a plurality of selection signal lines 91 through a connection line, and output ends of the plurality of multiplexing circuits 90 are respectively connected with a plurality of data signal lines of the display area 100 through a selection output line 92 correspondingly.

In an exemplary embodiment, the plurality of selection signal lines 91 may have a bar shape extending in an extending direction of the display area boundary, and the plurality of selection signal lines 91 may be provided on a side of the plurality of multiplexing circuits 90 away from the display area and between the plurality of multiplexing circuits 90 and the plurality of gate driving circuits 30. The high voltage power supply trace 80 may have a bar shape extending in the extending direction of the display area boundary, and may be provided on a side of the plurality of multiplexing circuits 90 close to the display area. The high voltage power supply traces 80 is configured to be connected in correspondence with a plurality of first power supply lines of the display area 100.

In an exemplary embodiment, shape, connection relationship, and providing posture of the gate driving circuit 30 and the gate signal line 31 in the third corner portion 213 may be substantially the same as those in the first corner portion, and the plurality of gate driving circuits 30 are provided in a rotational manner in the third corner portion 213 of a fan-ring shape to form an annular arrangement.

In an exemplary embodiment, a fourth bezel (lower bezel) 204 in the bezel area 200 may be provided with a plurality of multiplexing circuits 90 which may be provided in sequence in the first direction X and have substantially the same shape and providing posture. At least one multiplexing circuit 90 may have a third center line, which may be a straight line bisecting the multiplexing circuit 90 in the first direction X and extending in the second direction Y. The plurality of multiplexing circuits 90 have substantially the same providing posture, which means that the angle between the third center line of the plurality of multiplexing circuits 90 and the second direction Y is about 0 degrees.

In an exemplary embodiment, a third corner portion (lower left corner area) 213 of the bezel area 200 located between the first bezel (left bezel) and the fourth bezel 204 may be provided with a plurality of multiplexing circuits 90 and a plurality of gate driving circuits 30. In an exemplary embodiment, the plurality of multiplexing circuits 90 of the third corner portion 213 may have substantially the same shape, but are provided in different postures. The included angle between the third center line of the plurality of test circuits 70 and the second direction Y is gradually increased in a direction away from the fourth bezel 204 (close to the first bezel), that is, the plurality of multiplexing circuits 90 gradually increases the rotation angle so that the plurality of multiplexing circuits 90 form an annular arrangement. In an exemplary embodiment, the plurality of gate driving circuits 30 of the third corner portion 213 may have substantially the same shape, but are provided in different postures. The included angle between the second center line of the plurality of gate driving circuits 30 and the first direction X is gradually increased in a direction away from the first bezel (close to the fourth bezel 204), that is, the plurality of gate driving circuits 30 gradually increases the rotation angle so that the plurality of gate driving circuits 30 form an annular arrangement.

In an exemplary embodiment, edges of the plurality of annularly arranged multiplexing circuits 90 on a side away from the display area may form an arcuate third edge line, edges of the plurality of annularly arranged gate driving circuits 30 on a side close to the display area may form an arcuate fourth edge line, a third distance between the third edge line and the display area boundary may be less than a fourth distance between the fourth edge line and the display area boundary, the third distance may be a minimum distance between the third edge line and the display area boundary, and the fourth distance may be a minimum distance between the fourth edge line and the display area boundary.

In an exemplary embodiment, at least one dummy circuit 90A may be provided in the third corner portion 213, the dummy circuit 90A may be located in the first circuit area 221 and provided between the multiplexing circuits 90, shape and providing posture of the dummy circuit 90A may be substantially the same as those of the multiplexing circuit 90, but an output end of the dummy circuit 90A is connected with the high voltage power supply trace 80 through the selection output line 92. By providing a dummy circuit in the clearance area when the multiplexing circuit is rotationally arranged, the present disclosure may ensure the uniformity of the etching process, and avoid the static electricity generated by the floating connection of the dummy circuit by means of connecting the dummy circuit with the high voltage power supply trace of the constant voltage signal, thus improving the working stability of the multiplexing circuit.

In an exemplary embodiment, the circuit area 220 may further include a plurality of source output signal lines 93, first ends of which are connected with an integrated circuit of a binding area, and second ends of which extend to the circuit area 220 and then are connected with the corresponding multiplexing circuits 90.

In an exemplary embodiment, in the fourth bezel 204, an orthographic projection of at least one source output signal line 93 on the base substrate and an orthographic projection of the plurality of selection signal lines 91 on the base substrate have a first overlapping area. In the third corner portion 213, an orthographic projection of at least one source output signal line 93 on the base substrate and an orthographic projection of the plurality of selection signal lines 91 on the base substrate have a second overlapping area. The first overlapping area is substantially equal to the second overlapping area. For example, the first overlapping area may be about 0.9*second overlapping area to 1.1*second overlapping area, or the second overlapping area may be about 0.9*first overlapping area to 1.1*first overlapping area.

In an exemplary embodiment, a structure of the fourth corner portion may be substantially the same as that of the third corner portion, and the structure of the third corner portion and the structure of the fourth corner portion may be mirror-symmetrical with respect to the display area.

Figure 27:
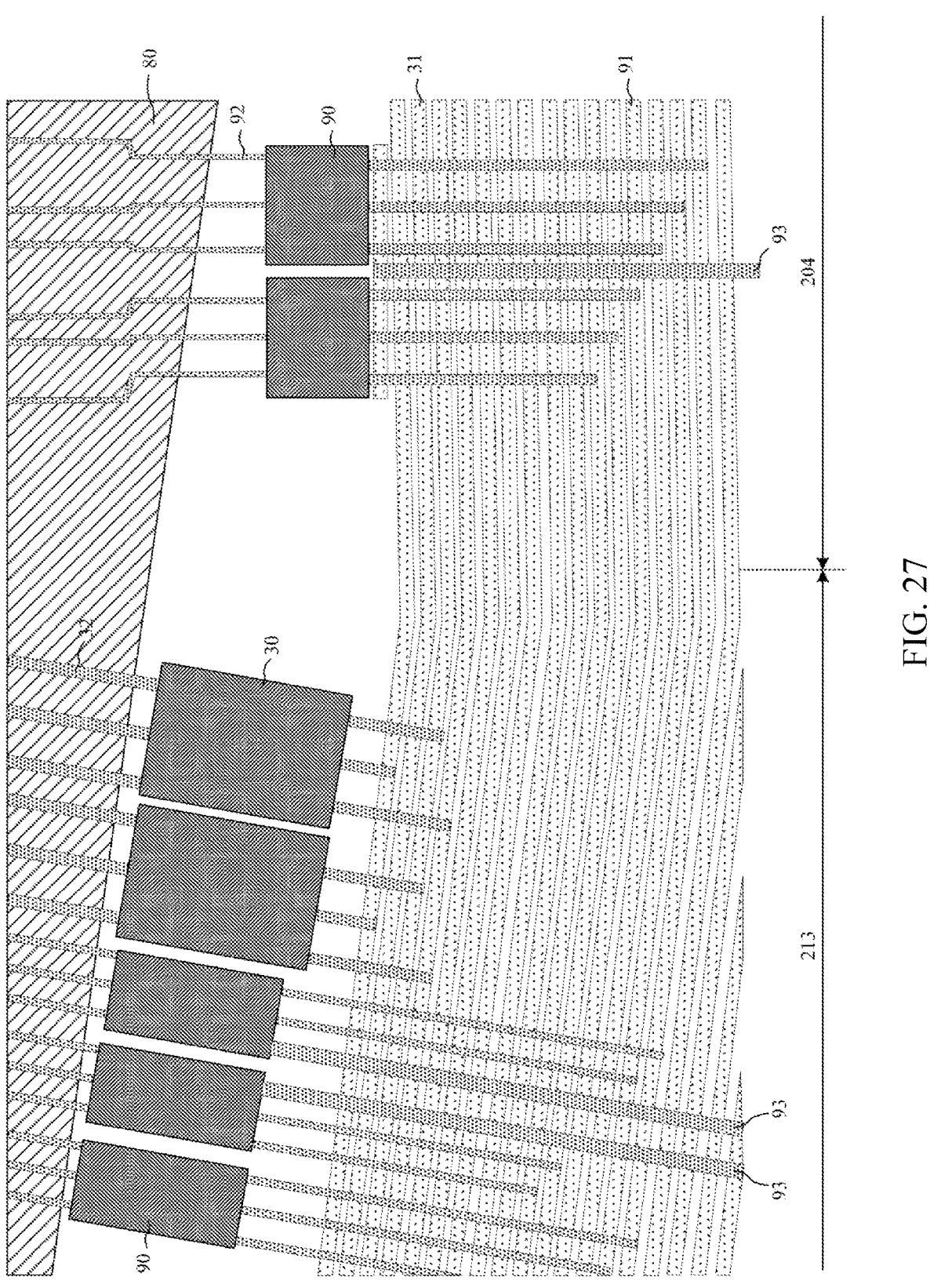
FIG. 27 is a schematic diagram of an arrangement of multiplexing circuits and gate driving circuits of an existing display substrate.

FIG. 27 is a schematic diagram of an arrangement of multiplexing circuits and gate driving circuits of an existing display substrate. As shown in FIG. 27, in the fourth bezel 204, a plurality of multiplexing circuits 90 may be provided in sequence in the first direction X. In the third corner portion 213, a plurality of multiplexing circuits 90 and a plurality of gate driving circuits 30 may be arranged side by side and alternately in the extending direction of the display area boundary, that is, the multiplexing circuit 90 may be provided between the gate driving circuits 30. When the multiplexing circuits 90 and the gate driving circuits 30 located in the third corner portion 213 are arranged in a rotational manner. In order to provide sufficient rotational arrangement space, the multiplexing circuit 90 needs to be elongated in the direction away from the display area and compressed in the extending direction of the display area boundary. Therefore, the multiplexing circuits 90 provided in the fourth bezel 204 and the third corner portion 213 have two different layout structures. The multiplexing circuits in the fourth bezel 204 has a layout structure wide in the horizontal direction and narrow in the vertical direction, and the multiplexing circuits in the third corner portion 213 has a layout structure narrow in the horizontal direction and wide in the vertical direction. According to the research of the inventor of the present application, the structure of the existing substrate makes the parasitic capacitance generated by the two kinds of multiplexing circuits different from that generated by the film layers of other structures, and due to the difference in parasitic capacitance, the brightness difference of the pixel columns controlled by the two kinds of multiplexing circuits is generated, resulting in the defect of wide white stripes in the middle. In addition, since the source output signal lines 93 in the fourth bezel 204 and the source output signal lines 93 in the third corner portion 213 have different shapes and connection modes, the first overlapping area of the source output signal lines 93 and the plurality of selection signal lines 91 in the fourth bezel 204 is different from the second overlapping area of the source output signal lines 93 and the plurality of selection signal lines 91 in the third corner portion 213, resulting in uneven parasitic capacitance, unstable voltage of the source output signal lines 93, and poor vertical dark lines of low gray scale.

In the display substrate provided by the exemplary embodiment of the present disclosure, the circuit area of the bezel area is provided as a first circuit area and a second circuit area, the multiplexing circuit is provided in the inner first circuit area, and the gate driving circuit is provided in the outer second circuit area, so that the multiplexing circuit of the fourth bezel area and the multiplexing circuit of the third corner portion adopt the same layout design, the shapes of the multiplexing circuits in the two areas are basically the same, and the parasitic capacitances of the multiplexing circuits in the two areas are basically the same, thus eliminating the difference of the parasitic capacitance and effectively avoiding the defect of wide white strip in the middle in the existing display substrate. Since the multiplexing circuit of the fourth bezel area and the multiplexing circuit of the third corner portion adopt the same layout design, the first overlapping area of the source output signal line and the plurality of selection signal lines in the fourth bezel is basically equal to the second overlapping area of the source output signal line and the plurality of selection signal lines in the third corner portion, thus eliminating the problem of uneven parasitic capacitance, ensuring the stability of the voltage of the source output signal line and effectively avoiding the defect of low gray scale vertical dark lines in the existing display substrate. By providing a dummy unit in the clearance area when the multiplexing circuit is rotationally arranged, the present disclosure may ensure the uniformity of the etching process, and avoid the static electricity generated by the floating connection of the dummy circuit by means of connecting the dummy circuit with the high voltage power supply trace of the constant voltage signal, thus improving the working stability of the multiplexing circuit.

The foregoing structure of the display substrate and its preparation process in the present disclosure are only exemplary description. In an exemplary embodiment, the corresponding structure may be changed according to actual needs, which is not limited in the present disclosure.

The present disclosure further provides a preparation method of a display substrate for preparing the aforementioned display substrates. In an exemplary embodiment, the display substrate includes a display area and a bezel area located on a periphery of the display area, wherein the bezel area at least includes a capacitance area, the display area includes a plurality of sub-pixels forming a plurality of pixel rows and a plurality of pixel columns, quantities of sub-pixels in the pixel columns in a direction close to the bezel area are gradually reduced, a side of the display area close to the bezel area forms a first step-shaped display area boundary, the display area boundary includes a plurality of first steps connected in sequence, and the first steps have a first step length and a first step width; the preparation method includes:

forming a plurality of compensation capacitors in the capacitance area, and forming a second step-shaped capacitance area boundary on a side of the plurality of compensation capacitors away from the display area, wherein the capacitance area boundary includes a plurality of second steps connected in sequence, the second steps have a second step length and a second step width, the second step length is less than or equal to the first step length, the second step width is less than or equal to the first step width, the first step length and the second step length are dimensions of the first step and the second step in a pixel column direction respectively, and the first step width and the second step width are dimensions of the first step and the second step in a pixel row direction respectively.

The present disclosure further provides a display device, including the aforementioned display substrate. The display device may be any product or component with a display function, such as a mobile phone, a tablet computer, a television, a display, a laptop computer, a digital photo frame, and a navigator, and the present disclosure is not limited thereto.

Although the implementations disclosed in the present disclosure are described as above, the described contents are only implementations which are used for facilitating the understanding of the present disclosure, but are not intended to limit the present invention. Any skilled person in the art to which the present disclosure pertains may make any modifications and variations in forms and details of implementations without departing from the spirit and scope of the present disclosure. However, the patent protection scope of the present invention should be subject to the scope defined by the appended claims.

The invention claimed is:

1. A display substrate, comprising a display area and a bezel area located on a periphery of the display area, wherein the display area comprises a plurality of sub-pixels forming a plurality of pixel rows and a plurality of pixel columns, quantities of sub-pixels in at least part of the pixel columns are reduced in a direction close to the bezel area, and a first step-shaped display area boundary is formed on a side of the display area close to the bezel area;

the bezel area at least comprises a capacitance area, and the capacitance area comprises a plurality of compensation capacitors forming a second step-shaped capacitance area boundary on a side away from the display area; and the display area boundary comprises a plurality of first steps connected in sequence, the first steps have a first step length and a first step width, the capacitance area boundary comprises a plurality of second steps connected in sequence, the second steps have a second step length and a second step width, the second step length is less than or equal to the first step length, the second step width is less than or equal to the first step width, the first step length and the second step length are dimensions of the first step and the second step in a pixel column direction, respectively, and the first step width and the second step width are dimensions of the first step and the second step in a pixel row direction, respectively.

2. The display substrate according to claim 1, wherein the display area comprises a plurality of pixel column groups, at least one pixel column group comprises n pixel columns provided in sequence in the pixel row direction, quantities of sub-pixels of at least two pixel columns in the pixel column group are the same or the quantity of sub-pixels of each pixel column in the pixel column group is different, n is a positive integer greater than or equal to 2;

the bezel area comprises a plurality of capacitor groups, and at least one capacitor group comprises n compensation capacitors provided in sequence in the pixel row direction; and the capacitance groups are provided correspondingly to the pixel column groups.

3. The display substrate according to claim 2, wherein in the at least one capacitor group, at least one compensation capacitor has a bar shape extending in the pixel column direction.

4. The display substrate according to claim 2, wherein in the at least one capacitor group, at least one compensation capacitor at least comprises a main body portion and an expansion portion that are connected to each other, the main body portion has a bar shape extending in the pixel column direction, and the expansion portion has a bar shape extending in the pixel row direction.

5. The display substrate according to claim 2, wherein the plurality of capacitor groups at least comprise a plurality of first capacitor groups and a plurality of second capacitor groups that are alternately provided in an extending direction of the display area boundary.

6. The display substrate according to claim 5, wherein at least one pixel column group comprises a first pixel column, a second pixel column, and a third pixel column provided in sequence in the pixel row direction;

at least one first capacitor group comprises a first compensation capacitor, a second compensation capacitor, and a third compensation capacitor provided in sequence in the pixel row direction, the first compensation capacitor, the second compensation capacitor, and the third compensation capacitor being provided on a side of the first pixel column, the second pixel column, and the third pixel column in the pixel column direction, respectively;

the display substrate comprises a reference line which is a straight line bisecting the display area in the pixel column direction and extending in the pixel row direction; and ends of the first compensation capacitor, the second compensation capacitor and the third compensation capacitor close to the reference line are substantially flush in the pixel row direction, and ends of the first compensation capacitor, the second compensation capacitor and the third compensation capacitor away from the reference line form a second step-shaped capacitance area boundary.

7. The display substrate according to claim 6, wherein a first length of the first compensation capacitor is less than a second length of the second compensation capacitor, the second length of the second compensation capacitor is less than a third length of the third compensation capacitor, a first width of the first compensation capacitor is greater than a second width of the second compensation capacitor, and the second width of the second compensation capacitor is greater than a third width of the third compensation capacitor; and the first length, the second length and the third length are maximum dimensions of the first compensation capacitor, the second compensation capacitor and the third compensation capacitor in the pixel column direction, respectively, and the first width, the second width and the third width are maximum dimensions of the first compensation capacitor, the second compensation capacitor and the third compensation capacitor in the pixel row direction, respectively.

8. The display substrate according to claim 6, wherein the first compensation capacitor at least comprises a first main body portion and a first expansion portion, a first end of the first main body portion is provided on a side of the first pixel column away from the reference line, a second end of the first main body portion extends in a direction away from the reference line in the pixel column direction, a first end of the first expansion portion is connected with a side of the first main body portion away from the display area, and a second end of the first expansion portion extends in a direction away from the display area in the pixel row direction, so that an end of the first compensation capacitor away from the display area forms a step shape.

9. The display substrate according to claim 8, wherein the first expansion portion at least comprises a first sub-portion and a second sub-portion, the first sub-portion is provided on a side of the second sub-portion close to the reference line, first ends of the first sub-portion and the second sub-portion are respectively connected with the side of the first main body portion away from the display area, second ends of the first sub-portion and the second sub-portion extend in the direction away from the display area in the pixel row direction, an extension length of the first sub-portion is greater than an extension length of the second sub-portion, the first sub-portion is located at one end of at least two compensation capacitors in the second capacitor group away from the reference line, and the second sub-portion is located at one end of at least one compensation capacitor in the at least two compensation capacitors away from the reference line.

10. The display substrate according to claim 6, wherein the second compensation capacitor at least comprises a second main body portion and a second expansion portion, a first end of the second main body portion is provided on a side of the second pixel column away from the reference line, a second end of the second main body portion extends in a direction away from the reference line in the pixel column direction, a first end of the second expansion portion is connected with a side of the second main body portion away from the display area, a second end of the second expansion portion extends in a direction away from the display area in the pixel row direction, the second expansion portion is located on a side of the first compensation capacitor away from the reference line, and the first compensation capacitor is located on a side of the second main body portion away from the display area, so that an end of the second compensation capacitor away from the display area forms a step shape.

11. The display substrate according to claim 6, wherein the third compensation capacitor at least comprises a third main body portion, a first end of the third main body portion is provided on a side of the third pixel column away from the reference line, and a second end of the second main body portion extends in a direction away from the reference line in the pixel column direction.

12. The display substrate according to claim 5, wherein at least one pixel column group comprises a first pixel column, a second pixel column, and a third pixel column provided in sequence in the pixel row direction;

at least one second capacitor group comprises a fourth compensation capacitor, a fifth compensation capacitor and a sixth compensation capacitor provided in sequence in the pixel row direction, the fourth compensation capacitor, the fifth compensation capacitor and the sixth compensation capacitor being provided on a side of the first pixel column, the second pixel column and the third pixel column in the pixel column direction, respectively;

the display substrate has a reference line which is a straight line that bisects the display area in the pixel column direction and extends in the pixel row direction; and ends of the fourth compensation capacitor, the fifth compensation capacitor and the sixth compensation capacitor close to the reference line are substantially flush in the pixel row direction, and ends of the fourth compensation capacitor, the fifth compensation capacitor and the sixth compensation capacitor away from the reference line form a second step-shaped capacitance area boundary.

13. The display substrate according to claim 12, wherein a fourth length of the fourth compensation capacitor is less than a fifth length of the fifth compensation capacitor, the fifth length of the fifth compensation capacitor is equal to a sixth length of the sixth compensation capacitor, a fourth width of the fourth compensation capacitor is greater than a fifth width of the fifth compensation capacitor, and the fifth width of the fifth compensation capacitor is equal to a sixth width of the sixth compensation capacitor; and the fourth length, the fifth length and the sixth length are maximum dimensions of the fourth compensation capacitor, the fifth compensation capacitor and the sixth compensation capacitor in the pixel column direction, respectively, and the fourth width, the fifth width and the sixth width are maximum dimensions of the fourth compensation capacitor, the fifth compensation capacitor and the sixth compensation capacitor in the pixel row direction, respectively.

14. The display substrate according to claim 12, wherein the fourth compensation capacitor at least comprises a fourth main body portion and a fourth expansion portion, a first end of the fourth main body portion is provided on a side of the first pixel column away from the reference line, a second end of the fourth main body portion extends in a direction away from the reference line in the pixel column direction, a first end of the fourth expansion portion is connected with a side of the fourth main body portion away from the display area, a second end of the fourth expansion portion extends in a direction away from the display area in the pixel row direction, the fourth expansion portion is located on a side of the first capacitor group away from the reference line, and at least one compensation capacitor in the first capacitor group is located on a side of the fourth main body portion away from the display area, so that an end of the fourth compensation capacitor away from the display area forms a step shape.

15. The display substrate according to claim 12, wherein the fifth compensation capacitor comprises at least a fifth main body portion, a first end of the fifth main body portion is provided on a side of the second pixel column away from the reference line, and a second end of the fifth main body portion extends in a direction away from the reference line in the pixel column direction.

16. The display substrate according to claim 12, wherein the sixth compensation capacitor comprises at least a sixth main body portion, a first end of the sixth main body portion is provided on a side of the third pixel column away from the reference line, and a second end of the sixth main body portion extends in a direction away from the reference line in the pixel column direction.

17. The display substrate according to claim 1, wherein the bezel area at least comprises a first bezel and a second bezel oppositely provided in the pixel row direction, a third bezel and a fourth bezel oppositely provided in the pixel column direction, a first corner portion connecting the first bezel with the third bezel, a second corner portion connecting the second bezel and the third bezel, a third corner portion connecting the first bezel and the fourth bezel, and a fourth corner portion connecting the second bezel and the fourth bezel; and the plurality of compensation capacitors are provided in any one or more of the first corner portion, the second corner portion, the third corner portion, and the fourth corner portion.

18. A display substrate, comprising a display area and a bezel area located on a periphery of the display area, wherein the display area comprises a plurality of sub-pixels forming a plurality of pixel rows and a plurality of pixel columns, at least one pixel column comprises a data signal line and a first power supply line, the bezel area at least comprises a plurality of compensation capacitors, at least one compensation capacitor comprises a first compensation plate and a second compensation plate, an orthographic projection of the first compensation plate on the display substrate is at least partially overlapped with an orthographic projection of the second compensation plate on the display substrate; and on a plane perpendicular to the display substrate, the display substrate comprises a base substrate and a first conductive layer, a second conductive layer, a third conductive layer and a fourth conductive layer provided in sequence on the base substrate, the data signal line is provided in the third conductive layer or the fourth conductive layer, the first power supply line is provided in the fourth conductive layer, the first compensation plate and the second compensation plate are provided in two of the first conductive layer to the fourth conductive layer, the first compensation plate is connected with one of the data signal line and the first power supply line, and the second compensation plate is connected with the other of the data signal line and the first power supply line.

19. The display substrate according to claim 18, wherein the at least one compensation capacitor further comprises a third compensation plate, an orthographic projection of the third compensation plate on the display substrate is at least partially overlapped with an orthographic projection of the first compensation plate on the display substrate, and an orthographic projection of the third compensation plate on the display substrate is at least partially overlapped with an orthographic projection of the second compensation plate on the display substrate; and the third compensation plate is provided between the first compensation plate and the second compensation plate, or the third compensation plate is provided on a side of the first compensation plate away from the second compensation plate, or the third compensation plate is provided on a side of the second compensation plate away from the first compensation plate.

20. A display device, comprising the display substrate according to claim 1.

\* \* \* \* \*